United States Patent
Xie et al.

(10) Patent No.: US 10,217,846 B1
(45) Date of Patent: Feb. 26, 2019

(54) VERTICAL FIELD EFFECT TRANSISTOR FORMATION WITH CRITICAL DIMENSION CONTROL

(71) Applicant: GLOBALFOUNDRIES INC., Grand Cayman (KY)

(72) Inventors: Ruilong Xie, Schenectady, NY (US); Steven Bentley, Menands, NY (US); Min Gyu Sung, Latham, NY (US); Chanro Park, Clifton Park, NY (US); Steven Soss, Cornwall, NY (US); Hui Zang, Guilderland, NY (US); Xusheng Wu, Ballston Lake, NY (US); Yi Qi, Niskayuna, NY (US); Ajey P. Jacob, Watervliet, NY (US); Murat K. Akarvardar, Saratoga Springs, NY (US); Siva P. Adusumilli, South Burlington, VT (US); Jiehui Shu, Clifton Park, NY (US); Haigou Huang, Rexford, NY (US); John H. Zhang, Altamont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/873,156

(22) Filed: Jan. 17, 2018

(51) Int. Cl.
*H01L 21/00* (2006.01)
*H01L 21/8238* (2006.01)
(Continued)

(52) U.S. Cl.
CPC .. *H01L 29/66666* (2013.01); *H01L 21/02505* (2013.01); *H01L 29/165* (2013.01);
(Continued)

(58) Field of Classification Search
CPC ............ H01L 29/4236; H01L 29/42372; H01L 29/7397; H01L 29/7813; H01L 29/66666;
(Continued)

(56) References Cited

U.S. PATENT DOCUMENTS 7,148,541 B2    12/2006  Park et al.
9,087,897 B1    7/2015   Anderson et al.
(Continued)

OTHER PUBLICATIONS

A. Veloso, "IMEC SI Based Vertical NWFET Devices," on a Proposal to Avoid Suffering From the Non Self-Aligned Nature of the Gate Electrode in a Vertical Flow, pp. 1-17.

*Primary Examiner* — Hsien Ming Lee
(74) *Attorney, Agent, or Firm* — Gibb & Riley, LLC; Anthony J. Canale

(57) ABSTRACT

Disclosed are a method of forming vertical field effect transistor(s) and the resulting structure. In the method, five semiconductor layers are formed in a stack by epitaxial deposition. The first and fifth layers are one semiconductor material, the second and fourth layers are another and the third layer is yet another. The stack is patterned into fin(s). Vertical surfaces of the second and fourth layers of the fin(s) are etched to form upper and lower spacer cavities and these cavities are filled with upper and lower spacers. Vertical surfaces of the third layer of the fin(s) are etched to form a gate cavity and this cavity is filled with a gate. Since epitaxial deposition is used to form the semiconductor layers, the thicknesses of these layers and thereby the heights of the spacer cavities and gate cavity and the corresponding lengths of the spacers and gate can be precisely controlled.

11 Claims, 32 Drawing Sheets

(51) Int. Cl.
*H01L 21/336* (2006.01)
*H01L 29/66* (2006.01)
*H01L 21/02* (2006.01)
*H01L 29/423* (2006.01)
*H01L 29/165* (2006.01)
*H01L 29/16* (2006.01)
*H01L 29/78* (2006.01)

(52) U.S. Cl.
CPC .... *H01L 29/1608* (2013.01); *H01L 29/42356* (2013.01); *H01L 29/66787* (2013.01); *H01L 29/7827* (2013.01)

(58) Field of Classification Search
CPC ........... H01L 29/66909; H01L 29/7828; H01L 29/7788; H01L 29/7827; H01L 29/78642; H01L 29/7926; H01L 29/7395; H01L 29/66348
See application file for complete search history.

(56) References Cited

U.S. PATENT DOCUMENTS

| | | | |
|---|---|---|---|
| 9,299,835 | B1 | 3/2016 | Anderson et al. |
| 9,312,383 | B1 | 4/2016 | Cheng et al. |
| 9,397,163 | B2 | 7/2016 | Campi, Jr. et al. |
| 9,536,793 | B1 | 1/2017 | Zhang et al. |
| 9,653,465 | B1 | 5/2017 | Balakrishnan et al. |
| 9,711,618 | B1 | 7/2017 | Cheng et al. |
| 9,728,635 | B1 | 8/2017 | Cheng et al. |
| 9,780,088 | B1 | 10/2017 | Balakrishnan et al. |
| 9,786,784 | B1 | 10/2017 | Song et al. |
| 10,014,390 | B1 * | 7/2018 | Bouche ............ H01L 29/66553 |
| 2017/0213900 | A1 | 7/2017 | Cheng et al. |
| 2017/0345897 | A1 | 11/2017 | Kang et al. |
| 2017/0365673 | A1 | 12/2017 | Cheng et al. |

* cited by examiner

VERTICAL FIELD EFFECT TRANSISTOR FORMATION WITH CRITICAL DIMENSION CONTROL

BACKGROUND

Field of the Invention

The present invention relates to vertical field effect transistors (VFETs) and, particularly, to methods of forming VFETs with critical dimension control and the resulting VFET structures.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths. Unfortunately, the smaller channel lengths resulted in a corresponding increase in short channel effects.

In response, a non-planar FET and, particularly, a fin-type FET (FINFET) was developed. A fin-type FET (FINFET) is a non-planar FET that incorporates a semiconductor fin (i.e., a relatively tall, thin, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel region. It should be noted that, because the semiconductor fin of the FINFET is so thin, any field effects exhibited at the top surface are insignificant (i.e., negligible).

Recently, a vertical FET (VFET) was developed to provide an increase in device density (i.e., an increase in the number of devices within a given chip area) over that achievable with FINFETs. A VFET similarly incorporates a semiconductor fin (i.e., a relatively tall, thin, rectangular-shaped, semiconductor body). However, in this case, the FET components are stacked vertically on a substrate as opposed to being positioned side by side across a substrate. Specifically, a VFET typically includes a lower source/drain region in a substrate, a semiconductor fin that extends upward from the lower source/drain region, and an upper source/drain region that is epitaxially grown on the top surface of the semiconductor fin. A gate (e.g., a metal gate) laterally surrounds the semiconductor fin, which functions as the channel region. The gate is electrically isolated from the lower source/drain region and the upper source/drain region by lower and upper spacer layers, respectively. However, given current techniques for forming such VFETs, critical dimension control (e.g., control of gate length, control of alignment of top and bottom junction doping to gate edges, etc.) can be challenging and can result in VFET performance variations (e.g., variations in threshold voltage). Therefore, there is a need in the art for an improved VFET formation method that provides for better critical dimension control.

SUMMARY

In view of the foregoing, disclosed herein is a method of forming one or more vertical field effect transistors (VFETs) with precise control of critical dimensions including upper and lower spacer lengths and gate length. In the method, epitaxial deposition can be used to form five semiconductor layers in a stack on a semiconductor substrate. The first and fifth layers can be one semiconductor material, the second and fourth layers can be another semiconductor material and the third layer can be yet another semiconductor material. The stack can then be patterned into fin(s), which is/are used to form the VFET(s). Specifically, vertical surfaces of the second and fourth semiconductor layers of the fin(s) can be selectively etched back to form upper and lower spacer cavities and these cavities can be filled with upper and lower spacers. Additionally, vertical surfaces of the third semiconductor layer of the fin(s) can be selectively etched back to form a gate cavity and this cavity can be filled with a gate structure. As a result, the lengths of the upper and lower spacers and the gate will be equal to the heights of the upper and lower spacer cavities and gate cavity, respectively, which, in turn, will be equal to the thicknesses of the second and fourth semiconductor layers and the third semiconductor layer, respectively. Furthermore, since epitaxial deposition is used to form the semiconductor layers, the thicknesses of these layers and thereby the lengths of the upper and lower spacers and the gate can be precisely controlled. Also disclosed herein are structures with one or more VFETs formed according to the above-described method.

More particularly, an embodiment of a method of forming a vertical field effect transistor (VFET) includes providing a semiconductor substrate and forming multiple semiconductor layers in a stack on the semiconductor substrate. The semiconductor layers in the stack can include a first semiconductor layer, a second semiconductor layer on the first semiconductor layer, a third semiconductor layer on the second semiconductor layer, a fourth semiconductor layer on the third semiconductor layer, and a fifth semiconductor layer on the fourth semiconductor layer. The stack can be patterned into a multi-layer semiconductor fin. Next, exposed vertical surfaces of the second semiconductor layer and the fourth semiconductor layer on the multi-layer semiconductor fin can be selectively etched back to form a lower spacer cavity laterally surrounding the second semiconductor layer of the multi-layer semiconductor fin and an upper spacer cavity laterally surrounding the fourth semiconductor layer of the multi-layer semiconductor fin. Spacers can then be formed in the spacer cavities. That is, a lower spacer can be formed in the lower spacer cavity and an upper spacer can be formed in the upper spacer cavity. After the spacers are formed, exposed vertical surfaces of the third semiconductor layer of the multi-layer semiconductor fin can be selectively etched back to form a gate cavity laterally surrounding the third semiconductor layer of the multi-layer semiconductor fin (i.e., between the lower spacer and the upper spacer). A gate structure can be formed in the gate cavity. Using the above-described process steps will result in the lengths of the upper and lower spacers and the gate structure being equal to the heights of the upper and lower spacer cavities and gate cavity, respectively, which, in turn, will be equal to the thicknesses of the second and fourth semiconductor layers and the third semiconductor layer, respectively. Since epitaxial deposition is used to form the semiconductor layers, the thicknesses of the semiconductor layers and thereby the lengths of the upper and lower spacers and the gate structure can be precisely controlled.

Also disclosed herein is an embodiment of a method of forming multiple vertical field effect transistors (VFETs) including at least a first-type VFET (e.g., a P-type VFET) and a second-type VFET (e.g., an N-type VFET). This embodiment of the method includes providing a semiconductor substrate and forming multiple semiconductor layers in a stack on the semiconductor substrate. The semiconductor layers in the stack can include a first semiconductor layer, a second semiconductor layer on the first semiconductor layer, a third semiconductor layer on the second semiconductor layer, a fourth semiconductor layer on the third semiconductor layer, and a fifth semiconductor layer on the fourth semiconductor layer. The first semiconductor layer and the fifth semiconductor layer can be doped with a first-type dopant (e.g., a P-type dopant). Additionally, at least some of the semiconductor layers in the stack can be made of different semiconductor materials in order to allow for selective etching during subsequent processing steps. Specifically, the semiconductor substrate and the third semiconductor layer can be a first semiconductor material (e.g., silicon); the first semiconductor layer and the fifth semiconductor layer can be a second semiconductor material (e.g., silicon germanium with a first percentage of germanium); and the second semiconductor layer and the fourth semiconductor layer can be a third semiconductor material (e.g., silicon germanium with a second percentage of germanium that is greater than the first percentage).

The stack can be patterned into multiple multi-layer semiconductor fins that extend vertically upward from a lower portion of the first semiconductor layer. An isolation region can subsequently be formed in the remaining lower portion of the first semiconductor layer to define the shapes of lower source/drain regions.

Next, exposed vertical surfaces of the second semiconductor layer and the fourth semiconductor layer on each multi-layer semiconductor fin can be selectively etched back to form a lower spacer cavity laterally surrounding the second semiconductor layer of the multi-layer semiconductor fin and an upper spacer cavity laterally surrounding the fourth semiconductor layer of the multi-layer semiconductor fin. Spacers can then be formed in the spacer cavities on each multi-layer semiconductor. That is, a lower spacer can be formed in the lower spacer cavity and an upper spacer can be formed in the upper spacer cavity. After the spacers are formed, exposed vertical surfaces of the third semiconductor layer on each multi-layer semiconductor fin can be selectively etched back to form a gate cavity laterally surrounding the third semiconductor layer of the multi-layer semiconductor fin (i.e., between the lower spacer and the upper spacer).

At this point in the method, since the first and fifth semiconductor layers and, optionally, the second and fourth semiconductor layer are doped with a first-type dopant, all of the source/drain regions will be first-type source/drain regions and extensions for first-type VFETs (e.g., P-type source/drain regions and extensions for P-type VFETs). However, if any of the VFETs are to be second-type VFETs (e.g., N-type VFETs), the first-type source/drain regions and extensions (e.g., the P-type source/drain regions and extensions) must be replaced with second-type source/drain regions and extensions (e.g., N-type source/drain regions and extensions). In this case, a conformal sacrificial layer can be deposited over the partially completed structure and a blanket sacrificial layer can be deposited onto the conformal sacrificial layer. Then, an opening can be formed in the blanket sacrificial layer and conformal sacrificial layer such that it extends vertically to the isolation region and such that it is positioned laterally immediately adjacent to a side of a selected multi-layer semiconductor fin (i.e., a multi-layer semiconductor fin designated for second-type VFET formation) and, thereby such that it exposes vertical surfaces of the first semiconductor layer and the fifth semiconductor layer on the selected multi-layer semiconductor fin. An isotropic etch process can then be performed in order to selectively remove exposed material of the first semiconductor layer, the second semiconductor layer, the fourth semiconductor layer and the fifth semiconductor layer in the opening. As a result of this isotropic etch process, a lower source/drain cavity is created below the third semiconductor layer of the selected multi-layer semiconductor fin and an upper source/drain cavity is created above the third semiconductor layer of the selected multi-layer semiconductor fin. A second-type (e.g., N-type) lower source/drain region and extension can be formed in the lower source/drain cavity and a second-type (e.g., N-type) upper source/drain region and extension can be formed in the upper source/drain cavity.

Remaining portions of the blanket sacrificial layer and conformal sacrificial layer can subsequently be removed and a gate structure can be formed in each gate cavity in order to complete the VFETs. Using the above-described process steps will result in the lengths of the upper and lower spacers and the gate structure of each VFET being equal to the heights of the upper and lower spacer cavities and gate cavity, respectively, which, in turn, will be equal to the thicknesses of the second and fourth semiconductor layers and the third semiconductor layer, respectively. Since epitaxial deposition is used to form the semiconductor layers, the thicknesses of these layers and thereby the lengths of the upper and lower spacers and the gate structures can be precisely controlled.

Also disclosed herein are embodiments of an integrated circuit (IC) structure formed according to the above-described method. The IC structure can include a semiconductor substrate and one or more vertical field effect transistors (VFETs) on the semiconductor structure. For example, the structure can include a first-type VFET (e.g., a P-type VFET) and/or a second-type VFET (e.g., an N-type VFET) on the semiconductor substrate.

The first-type VFET (e.g., a P-type VFET) can include a first lower source/drain region on the semiconductor substrate, a first lower source/drain extension the first lower source/drain region, and a first lower spacer on the first lower source/drain region and laterally surrounding the first lower source/drain extension. The first-type VFET can further include a first channel region on the first lower source/drain extension and a first gate structure on the first lower spacer and laterally surrounding the first channel region. The first-type VFET can further include a first upper source/drain extension on the first channel region, a first upper spacer on the first gate structure and laterally surrounding the first upper source/drain extension, and a first upper source/drain region on the first upper source/drain extension and extending laterally onto the first upper spacer.

In this first-type VFET, the first channel region can be a first semiconductor material (e.g., silicon). The first lower source/drain region and the first upper source/drain region can be a second semiconductor material (e.g., silicon germanium with a first percentage of germanium). The first lower source/drain region and the first upper source/drain region can further be doped with a first-type dopant (e.g., a P-type dopant). The first lower source/drain extension and the first upper source/drain extension can be a third semiconductor material (e.g., silicon germanium with a second percentage of germanium that is greater than the first percentage).

The second-type VFET (e.g., an N-type VFET) can include a second lower source/drain region on the semiconductor substrate, a second lower source/drain extension on the second lower source/drain region, and a second lower spacer on the second lower source/drain region and laterally surrounding the second lower source/drain extension. The second-type VFET can further include a second channel region on the second lower source/drain extension and a second gate structure on the second lower spacer and laterally surrounding the second channel region. The second-type VFET can further include a second upper source/drain extension on the second channel region, a second upper spacer on the second gate structure and laterally surrounding the second upper source/drain extension, and a second upper source/drain region on the second upper source/drain extension and extending laterally onto the second upper spacer.

In this second-type VFET, the second channel region can be the first semiconductor material (e.g., silicon). The second lower source/drain region, the second upper source/drain region, the second lower source/drain extension and the second upper source/drain extension can all be a fourth semiconductor material, which is either the same as the first semiconductor material (e.g., silicon) or different from the first, second and third semiconductor materials (e.g., silicon carbide). The second lower source/drain region, the second upper source/drain region, the second lower source/drain extension and the second upper source/drain extension can all further be doped with a second-type dopant (e.g., an N-type dopant).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, as mentioned above critical dimension control (e.g., control of gate length, control of alignment of top and bottom junction doping to gate edges, etc.) can be challenging with current methods of forming vertical field effect transistors (VFETs). For example, the lengths of the lower and upper spacers, which define the spacing between the channel region and the lower and upper source/drain regions, respectively, of a VFET are achieved by depositing spacer material and then recessing the spacer material using a timed etch process. Similarly, the length of the gate of a VFET is defined by depositing sacrificial gate material and then recessing the sacrificial gate material using a timed etch process. However, those skilled in the art will recognize that there can be a lot of process variation when using timed etch processes. As a result, VFET performance variations (e.g., variations in threshold voltage) can occur.

In view of the foregoing, disclosed herein is a method of forming one or more vertical field effect transistors (VFETs) with precise control of critical dimensions including upper and lower spacer lengths and gate length. In the method, epitaxial deposition can be used to form five semiconductor layers in a stack on a semiconductor substrate. The first and fifth layers can be one semiconductor material, the second and fourth layers can be another semiconductor material and the third layer can be yet another semiconductor material. The stack can then be patterned into fin(s), which is/are used to form the VFET(s). Specifically, vertical surfaces of the second and fourth semiconductor layers of the fin(s) can be selectively etched back to form upper and lower spacer cavities and these cavities can be filled with upper and lower spacers. Additionally, vertical surfaces of the third semiconductor layer of the fin(s) can be selectively etched back to form a gate cavity and this cavity can be filled with a gate structure. As a result, the lengths of the upper and lower spacers and the gate will be equal to the heights of the upper and lower spacer cavities and gate cavity, respectively, which, in turn, will be equal to the thicknesses of the second and fourth semiconductor layers and the third semiconductor layer, respectively. Furthermore, since epitaxial deposition is used to form the semiconductor layers, the thicknesses of these layers and thereby the lengths of the upper and lower spacers and the gate can be precisely controlled. Also disclosed herein are structures with one or more VFETs formed according to the above-described method.

More particularly, disclosed herein are embodiments of a method of forming one or more vertical field effect transistors (VFETs) including one or more first-type VFETs (e.g., P-type VFETs) and/or one or more second-type VFETs (e.g., N-type VFETs).

Figure 1:
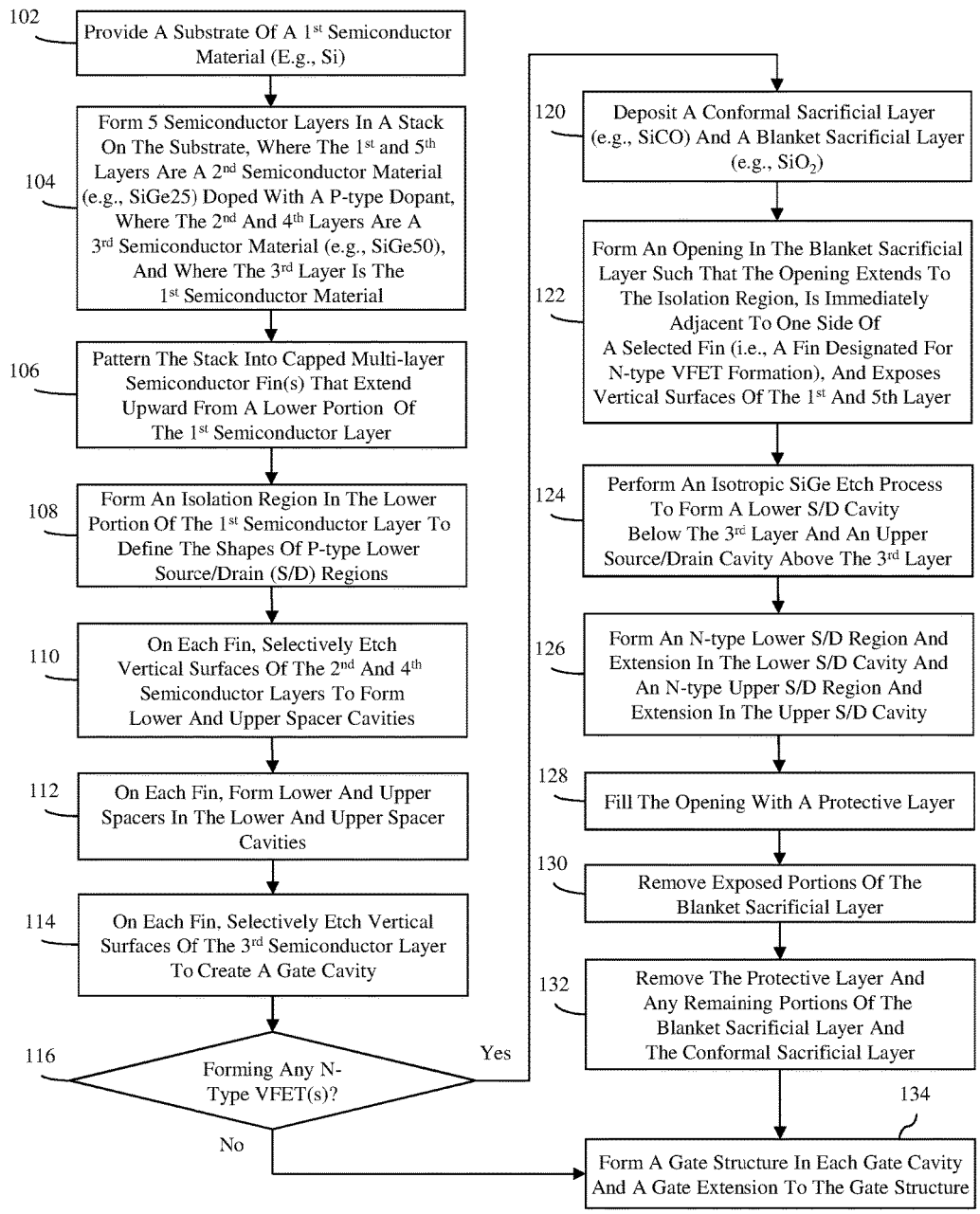
FIG. 1 is a flow diagram illustrating embodiments of a method of forming vertical field effect transistor(s) (VFET(s))
Figure 2:
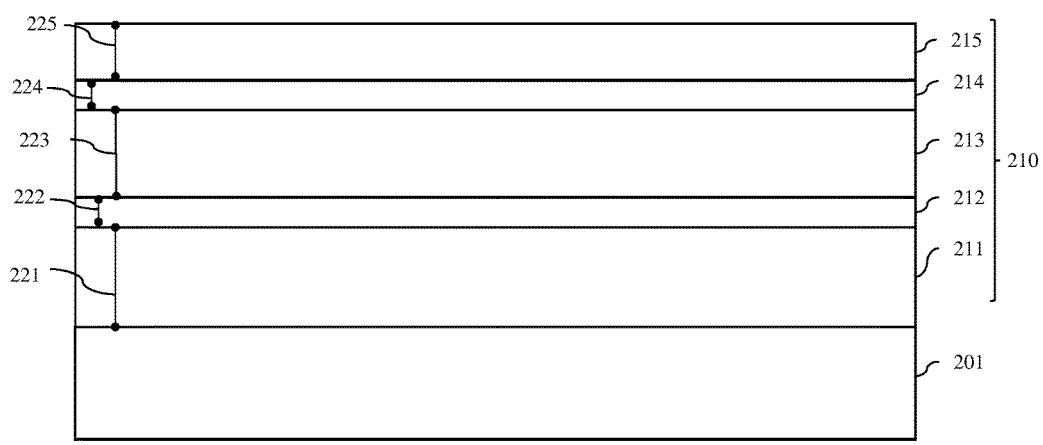
FIG. 2 is a cross-section diagram illustrating a partially completed structure formed according to the flow diagram of FIG. 1.

The method can include providing a semiconductor substrate 201 (see process 102 and FIG. 2). The semiconductor substrate 201 can be, for example, a bulk semiconductor substrate made of a first semiconductor material 204. This first semiconductor material 204 can be, for example, monocrystalline silicon. Alternatively, the semiconductor substrate 201 can be the semiconductor layer of a semiconductor-on-insulator structure.

The method can further include forming multiple semiconductor layers and, particularly, five discrete semiconductor layers 211-215 in a stack 210 on the semiconductor substrate 201 (see process 104 and FIG. 2). Specifically, the semiconductor layers formed at process 104 can include a first semiconductor layer 211, a second semiconductor layer 212 on the first semiconductor layer 211, a third semiconductor layer 213 on the second semiconductor layer 212, a fourth semiconductor layer 214 on the third semiconductor layer 213, and a fifth semiconductor layer 215 on the fourth semiconductor layer 214.

These semiconductor layers 211-215 can each be formed by epitaxial deposition so that the thicknesses of each of the layers 211-215 can be precisely controlled. As discussed in greater detail below, the first semiconductor layer 211 can be epitaxially deposited so as to have a first thickness 221, which will be equal to the desired height of the lower source/drain region in each VFET. The second semiconductor layer 212 can be epitaxially deposited so that it has a second thickness 222, which is equal to the desired length (also referred therein as the height) of the lower spacer that will separate the lower source/drain region from the gate structure in each VFET. The third semiconductor layer 213 can be epitaxially deposited so that it has a third thickness 223, which is equal to the desired length of the gate structure (i.e., the gate length, also referred to herein as the gate height) in each VFET. The fourth semiconductor layer 214 can be epitaxially deposited so that it has a fourth thickness 224, which is equal to the desired length (also referred to herein as the height) of the upper spacer that will separate the upper source/drain region from the gate structure in each VFET. Finally, the fifth semiconductor layer 215 can be epitaxially deposited so as to have a fifth thickness 225, which is equal to the desired length (also referred to herein as the height) of the upper source/drain region in each VFET.

Additionally, at least some of the semiconductor layers formed at process 104 can be made of different semiconductor materials in order to allow for selective etching during subsequent processing steps. For purpose of this disclosure, "selective etching" refers to an etch process wherein the etch specifications used ensure that one specific material is etched at a significantly faster rate than other materials such that surfaces of the other materials are either not impacted at all by the etch process or only minimally impacted. Specifically, the first semiconductor layer 211 and the fifth semiconductor layer 215 can be a second semiconductor material that is different from the first semiconductor material of the semiconductor substrate 201. This second semiconductor material can be, for example, silicon germanium with a first percentage of germanium (e.g., with 20% germanium, 25% germanium, 30% germanium, or some other relatively low percentage of germanium). The second semiconductor layer 212 and the fourth semiconductor layer 214 can be a third semiconductor material that is different from both the first semiconductor material and the second semiconductor material. For example, the third semiconductor material can be germanium or can be silicon germanium with a second percentage of germanium that is greater than the first percentage (e.g., with 50% germanium, 55% germanium, 60%, germanium, etc.). The third semiconductor layer can be, for example, the first semiconductor material (e.g., silicon). Thus, during subsequent processing, some of the semiconductor layers can be selectively etched over others.

Finally, at least the first semiconductor layer 211 and the fifth semiconductor layer 215 formed at process 104 can be in situ doped with a first-type dopant so as to have a first-type conductivity at a relatively high conductivity level that is suitable for the source/drain regions of first-type VFETs. Optionally, the second semiconductor layer 212 and the fourth semiconductor layer 214 can also be in situ doped with the first-type dopant so as to have the same first-type conductivity, at the same or a lower conductivity level. For example, if the first, second, fourth and fifth semiconductor layers are silicon germanium, which is an ideal source/drain material for P-type VFETs because it is improves charge carrier mobility in P-type VFETs, the first-type dopant can be a P-type dopant. In any case, the third semiconductor layer 213 can be undoped.

Figure 3A:
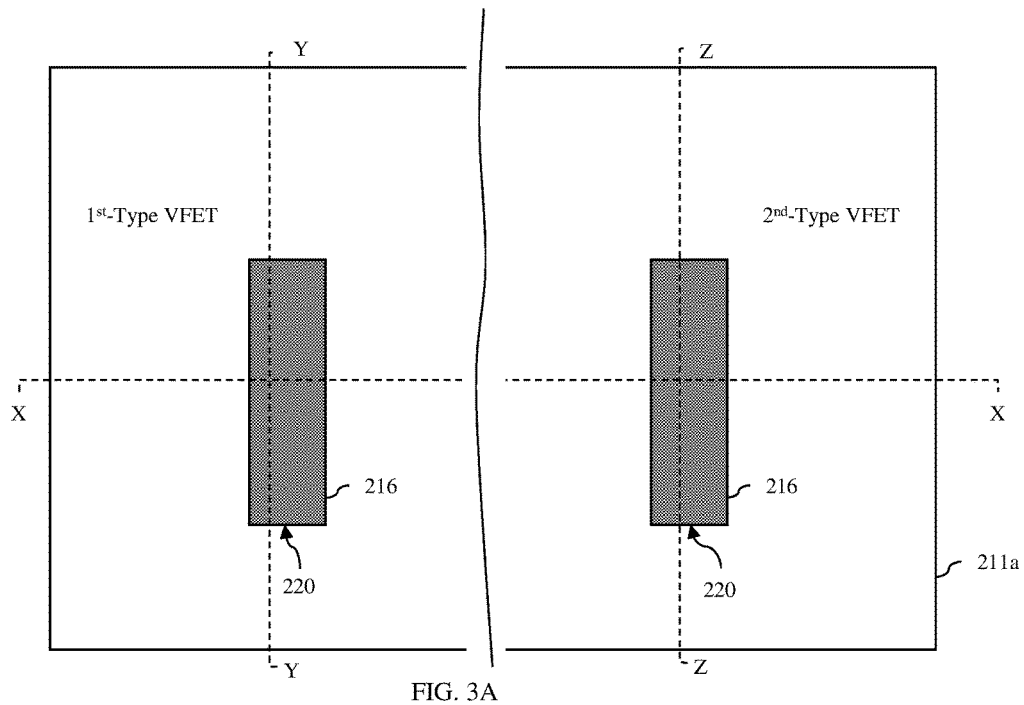
FIG. 3A is a top view diagram and FIGS. 3B-3C are different cross-section diagrams illustrating a partially completed structure formed according to the flow diagram of FIG. 1.
Figure 3B:
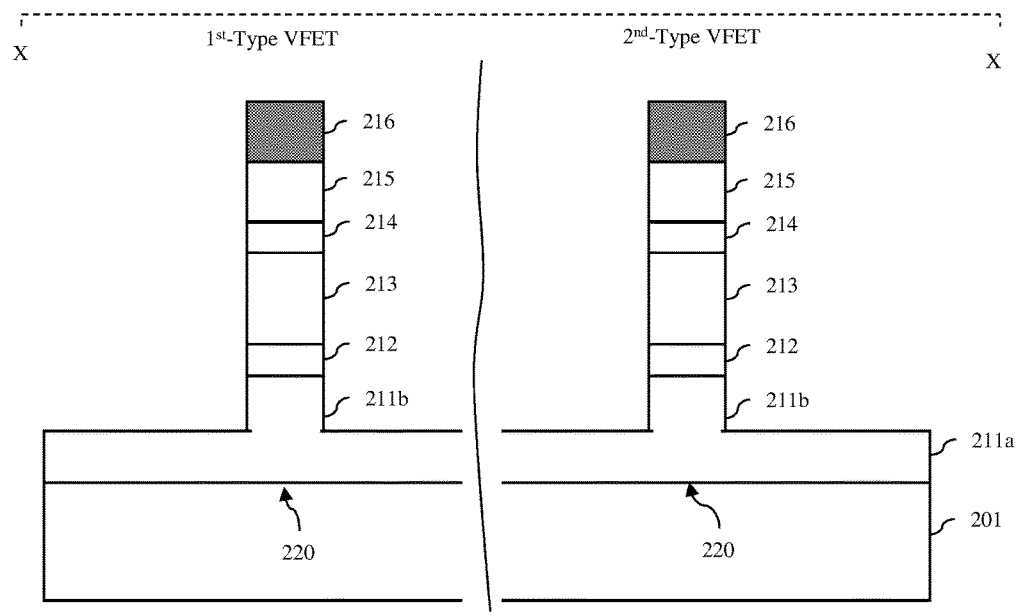

The stack 210 can then be patterned into one or more capped multi-layer semiconductor fins 220 (see process 106 and FIGS. 3A-3B). Specifically, a hard mask layer 216 (e.g., a silicon nitride hard mask layer) can be deposited on the top surface of the fifth semiconductor layer 215. The hard mask layer 216 can be patterned into one or more fin shapes using, for example, conventional lithographic and etch processes, sidewall image transfer processes, etc. An anisotropic etch process can then be performed and timed so as to etch through the fifth semiconductor layer 215, the fourth semiconductor layer 214, the third semiconductor layer 213, the second semiconductor layer 212 and into an upper portion 211b only of the first semiconductor layer 211. As a result, each multi-layer semiconductor fin 220 that is formed on the semiconductor substrate at process 106 extends essentially vertically upward from a lower portion 211a of the first semiconductor layer 211 and is capped by a fin-shaped portion of the hard mask layer 216. In subsequent process steps the capped multi-layer semiconductor fin(s) 220 formed at process 106 can be used to form the first-type VFET(s) (e.g., P-type VFET(s)) and/or the second-type VFET(s) (e.g., N-type VFET(s)).

Figure 3C:
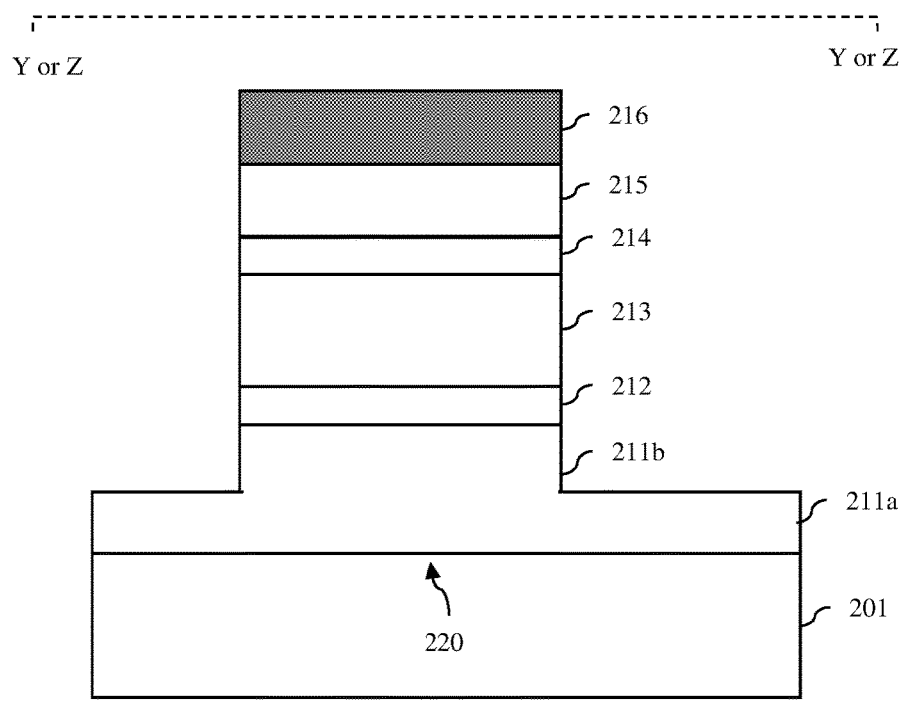
Figure 17:
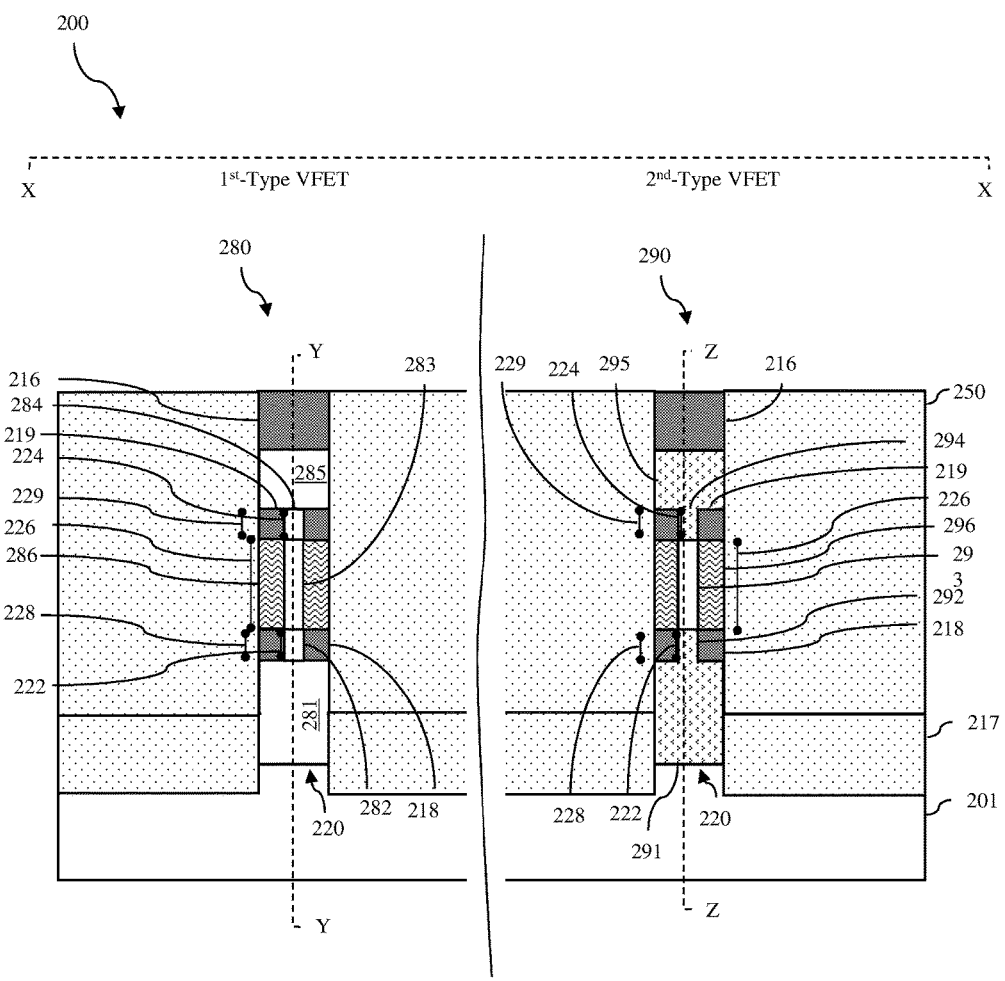
FIG. 17 is a cross-section diagram illustrating a structure formed according to the flow diagram of FIG. 1.
Figure 18A:
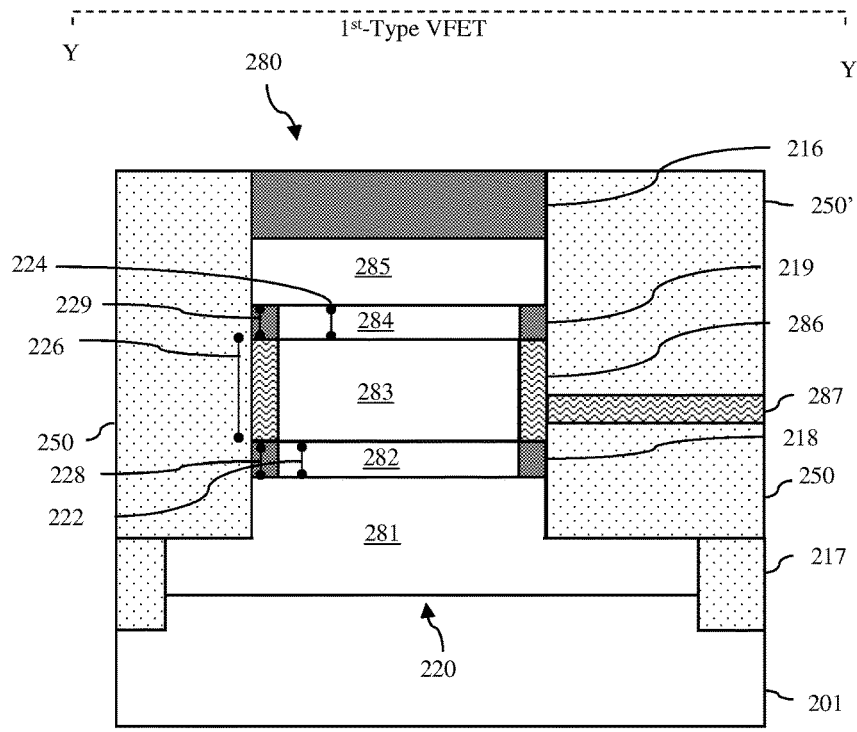
FIGS. 18A-18B are additional cross-section diagrams of the structure shown in FIG. 17, according to one embodiment.
Figure 18B:
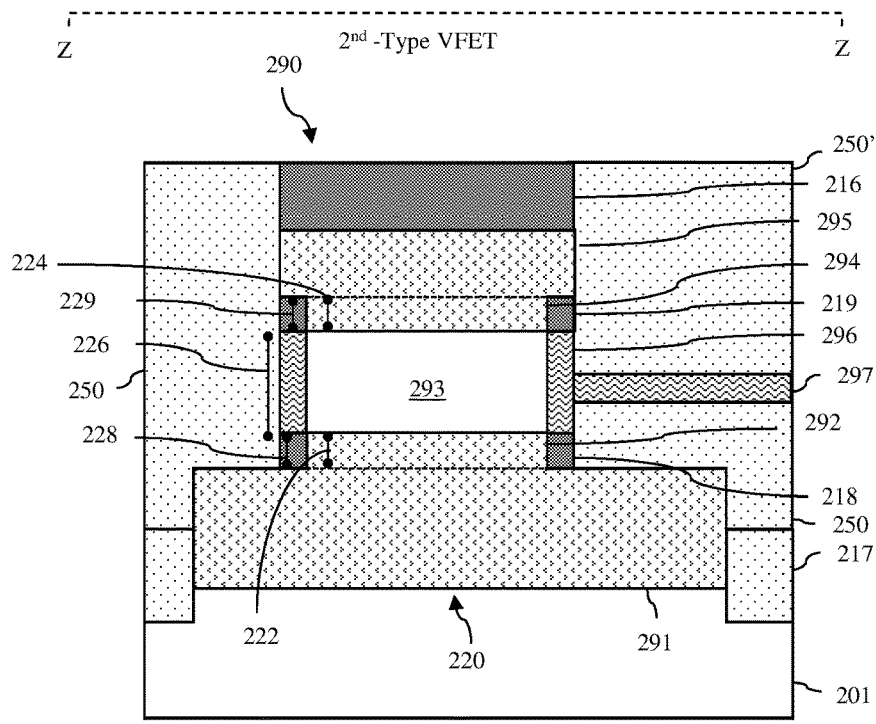
Figure 19A:
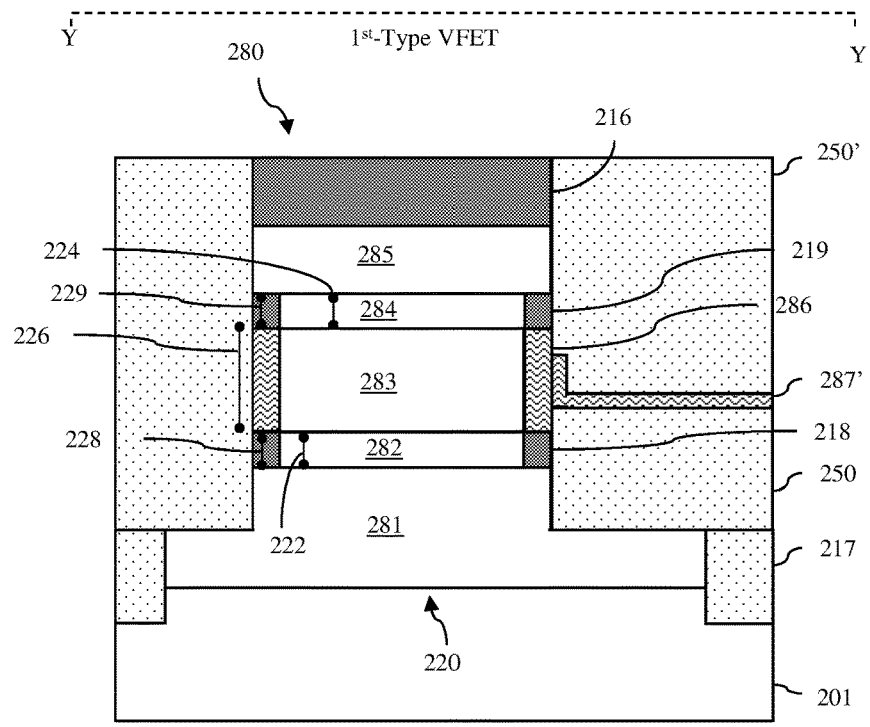
FIGS. 19A-19B are additional cross-section diagrams of the structure shown in FIG. 17, according to another embodiment.
Figure 19B:
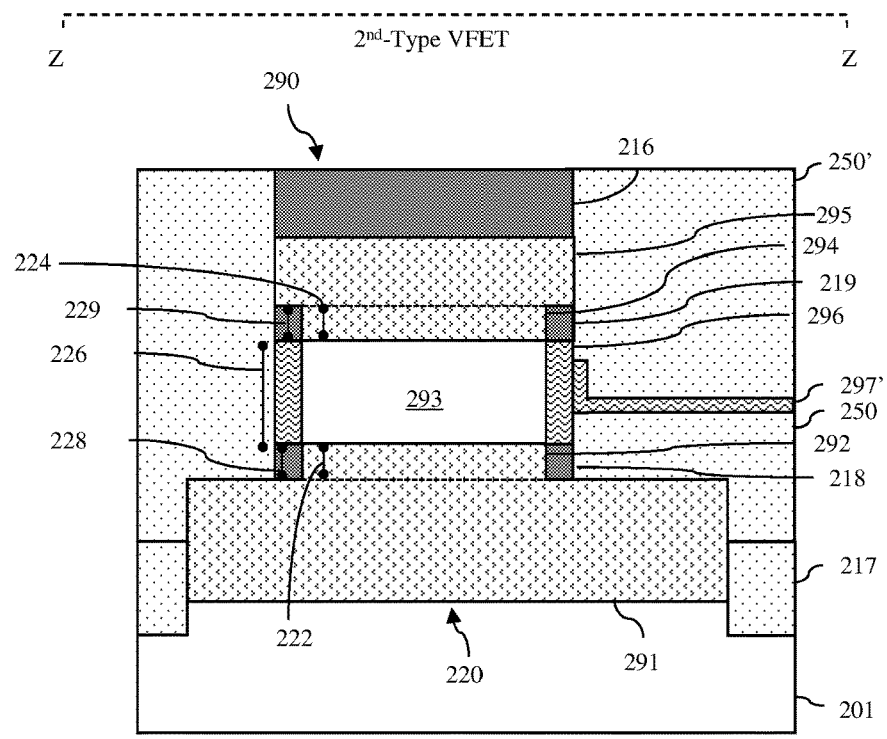

For purposes of illustration, two capped multi-layer semiconductor fins 220 are shown in the FIGS. 3A-3C and in subsequent process steps one of these capped multi-layer semiconductor fins 220 will be used to form a first-type VFET 280 (e.g., a P-type VFET) and another of these multi-layer semiconductor fins 220 will be used to form a second-type VFET 290 (e.g., an N-type VFET), as shown in FIG. 17 and FIGS. 18A-18B or, in the alternative, FIGS. 19A-19B. It should be understood that P-type and N-type VFETs are typically not formed side by side on a semiconductor substrate (i.e., not formed with the semiconductor fin(s) of a P-type VFET parallel and adjacent to the semiconductor fin(s) of an N-type VFET) and instead are often formed in different regions on a semiconductor substrate (e.g., formed with the semiconductor fin(s) of the P-type VFETs in end to end alignment with semiconductor fin(s) of the N-type VFETs). Thus, it should be understood that the figures are not intended to be limiting and that the curved line included in the figures between the first-type VFET and the second-type VFET are indicative of some separation between these VFETs.

Figure 4A:
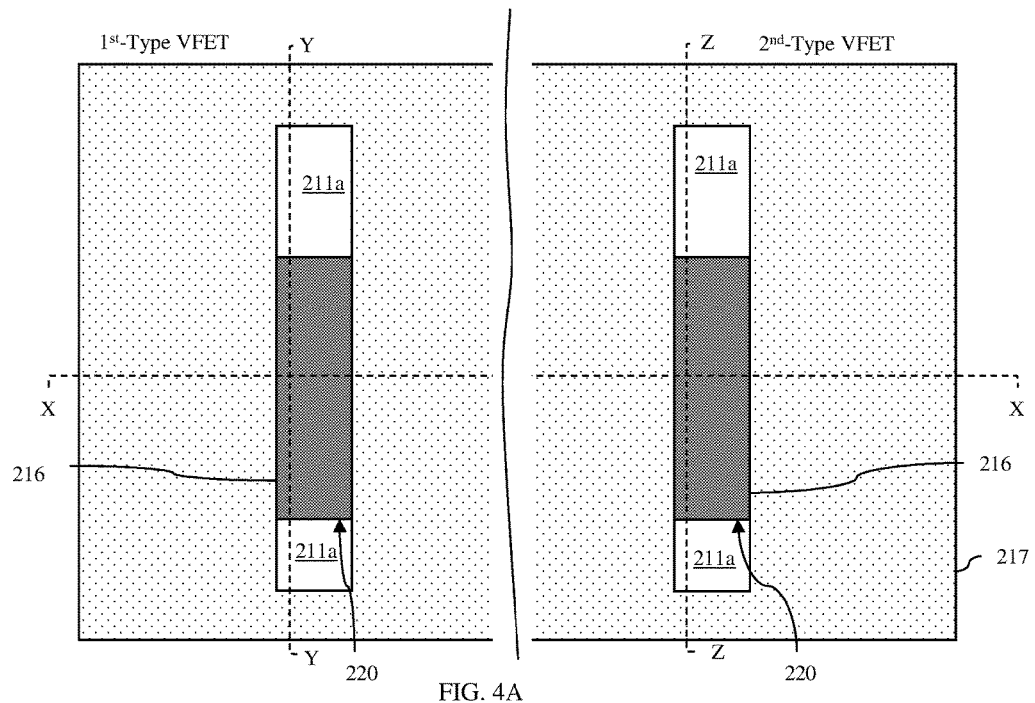
FIG. 4A is a top view diagram and FIGS. 4B-4C are different cross-section diagrams illustrating a partially completed structure formed according to the flow diagram of FIG. 1.
Figure 4B:
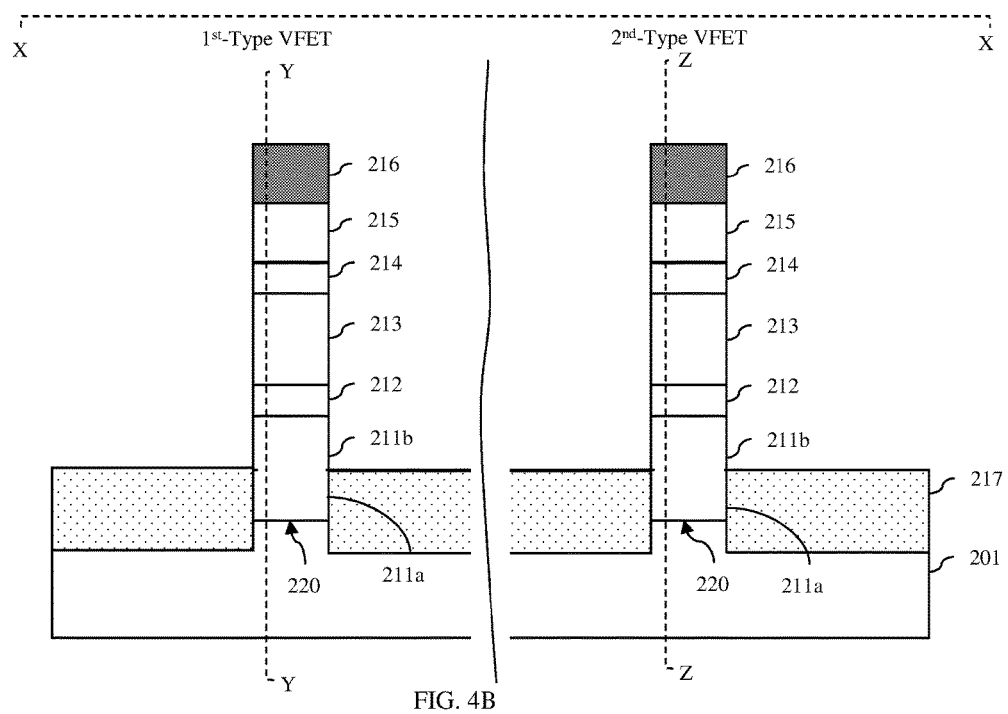
Figure 4C:
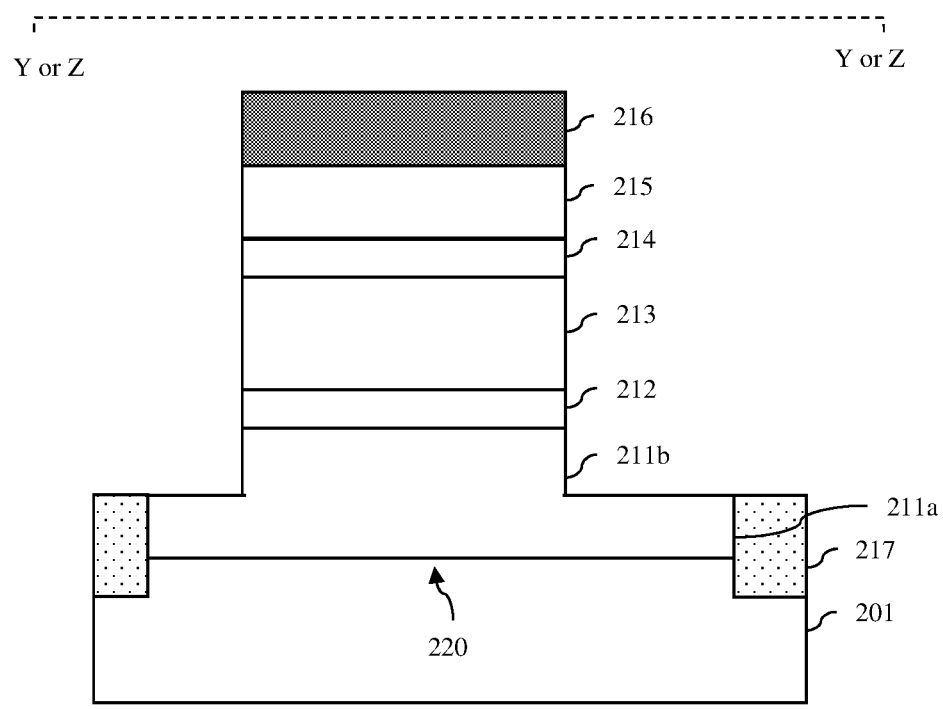

To form the VFETs 280 and 290, after the capped multi-layer semiconductor fins 220 are formed, an isolation region 217 can be formed in the lower portion 211a of the first semiconductor layer 211 between the multi-layer semiconductor fins 220 and the isolation region can define the boundaries (i.e., the shapes) of lower source/drain regions of any VFETs being formed (see process 108 and FIGS. 4A-4C). The isolation region 217 can be formed, for example, using conventional shallow trench isolation (STI) region formation techniques. Specifically, at least one trench can be lithographically patterned and etched into the lower portion 211a of the first semiconductor layer 211 in order to define the shapes of lower source/drain regions such that at least one multi-layer semiconductor fin 220 extends vertically upward from each lower source/drain region. Next, one or more layers of isolation material (e.g., a conformal layer of silicon nitride and a blanket layer of silicon dioxide) can be deposited so as to fill the trench(es). The isolation material can subsequently be etched back to expose the multi-layer semiconductor fins 220 and the top surface of the lower portion 211a of the first semiconductor layer. That is, the isolation material can be recessed such that the top surface of the isolation region 217 and the top surface of the lower portion 211a of the first semiconductor layer are approximately level. It should be noted that, alternatively, this isolation region 217 could be formed during subsequent processing (e.g., before gate formation). In any case, since, as mentioned above, the first semiconductor layer 211 is doped with a first-type dopant (e.g., a P-type dopant), each of the lower source/drain regions will have the first-type conductivity (e.g., will be P-type lower source/drain regions).

Figure 5:
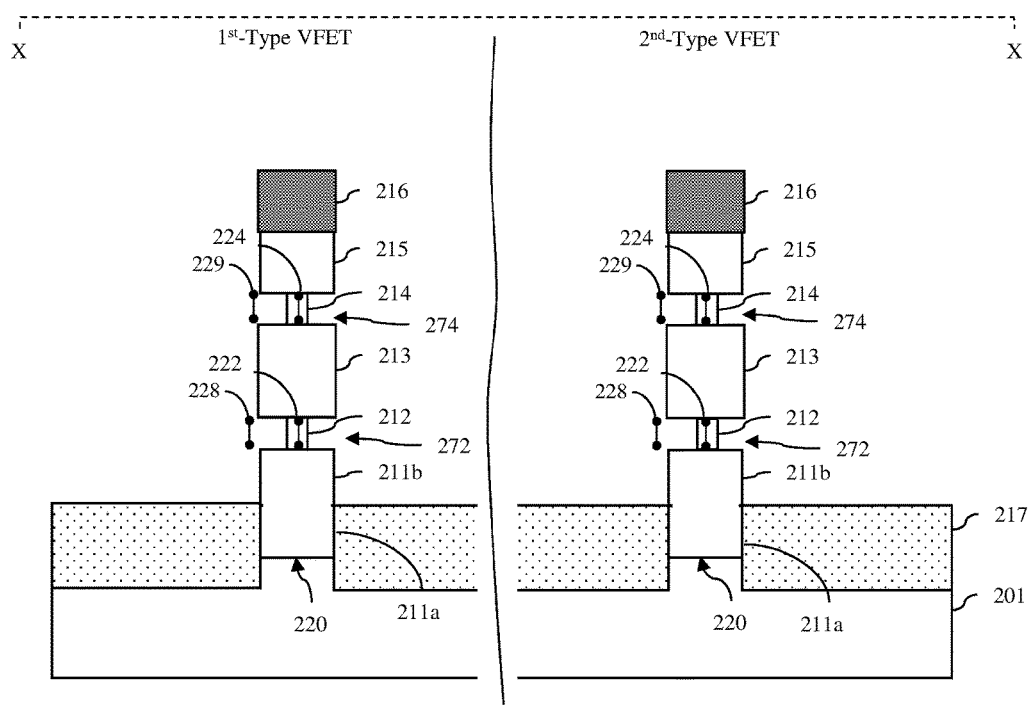
FIG. 5 is a cross-section diagram illustrating a partially completed structure formed according to the flow diagram of FIG. 1.

Next, exposed vertical surfaces of the second semiconductor layer 212 and the fourth semiconductor layer 214 on each multi-layer semiconductor fin 220 can be selectively etched back to form a lower spacer cavity 272 laterally surrounding the second semiconductor layer 212 of the multi-layer semiconductor fin 220 (i.e., below the outer edges of the third semiconductor layer 213) and an upper spacer cavity 274 laterally surrounding the fourth semiconductor layer 214 of the multi-layer semiconductor fin 220 (i.e., between the outer edges of the fifth semiconductor layer 215 above and the third semiconductor layer 213 below) (see process 110 and FIG. 5). Specifically, exposed vertical surfaces of the second semiconductor layer 212 and the fourth semiconductor layer 214 can be concurrently etched using, for example, an isotropic etch process that is selective for the third semiconductor material over the first semiconductor material, over the second semiconductor material, and over any adjacent dielectric materials (e.g., of the caps 216 and isolation region 217). For example, if the third semiconductor material of the second semiconductor layer 212 and the fourth semiconductor layer 214 is silicon germanium with a relatively high germanium percentage (e.g., 50% germanium), if the first semiconductor material of the third semiconductor layer 213 is silicon and the second semiconductor material of the first semiconductor layer 211 and the fifth semiconductor layer is silicon germanium with a relatively low germanium percentage (e.g., 25% germanium), a dry hydrochloric acid (HCL) etch process performed at approximately 550° C. can be performed at process 110 to selectively etch back the exposed vertical surfaces of the second and fourth semiconductor layers 212 and 214. Following process 110, on each multi-layer semiconductor fin 220, the height 228 of the lower spacer cavity 272 will be equal to the second thickness 222 of second semiconductor layer 212 and the height 229 of the upper spacer cavity 274 will be equal to the fourth thickness 224 of the fourth semiconductor layer 214.

Figure 6:
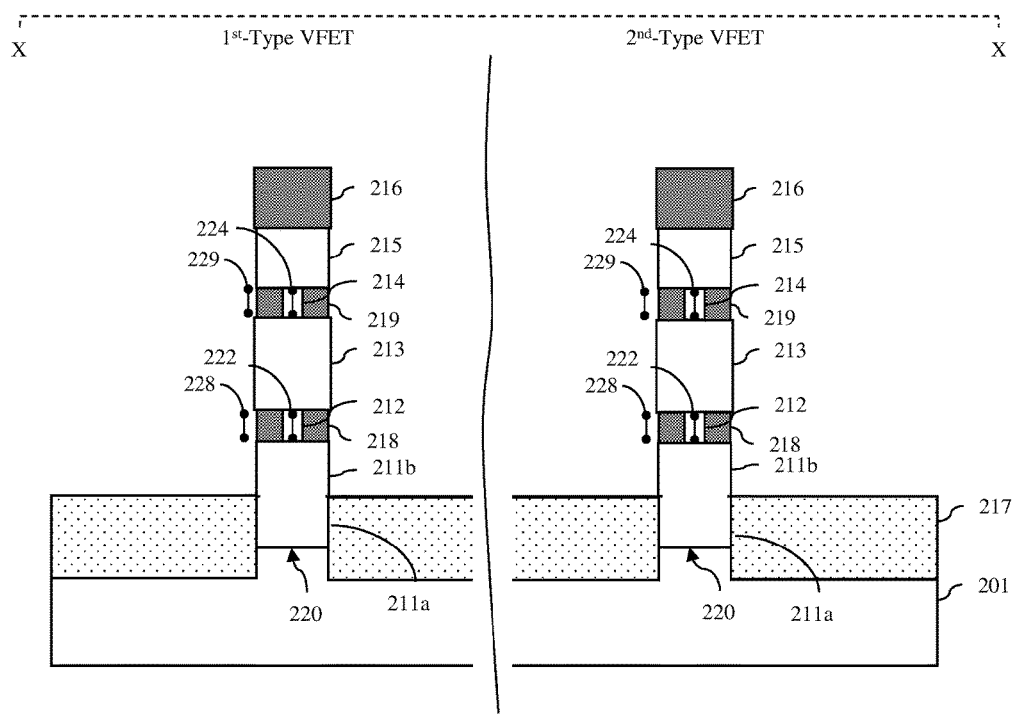
FIG. 6 is a cross-section diagram illustrating a partially completed structure formed according to the flow diagram of FIG. 1.

Spacers and, particularly, dielectric spacers can then be formed in the spacer cavities 272 and 274 on each multi-layer semiconductor (see process 112 and FIG. 6). That is, a lower spacer 218 can be formed in the lower spacer cavity 272 on each multi-layer semiconductor fin 220 and an upper spacer 219 can be formed in the upper spacer cavity. For example, a dielectric spacer material (e.g., silicon nitride) could be conformally deposited and then a selective isotropic etch process could be performed until all portions of the dielectric spacer material outside of the cavities are removed, stopping prior to removal of the dielectric spacer material from the spacer cavities. Alternatively, any other suitable technique could be performed in order to fill the lower and upper spacer cavities with lower and upper spacers, respectively. In any case, on each multi-layer semiconductor fin 220, the lower spacer 218 will have the same height 228 as the lower spacer cavity 272 (which is equal to the second thickness 222 of second semiconductor layer 212) and the upper spacer 219 will have the same height 229 as the upper spacer cavity 274 (which is equal to the fourth thickness 224 of the fourth semiconductor layer 214).

Figure 7:
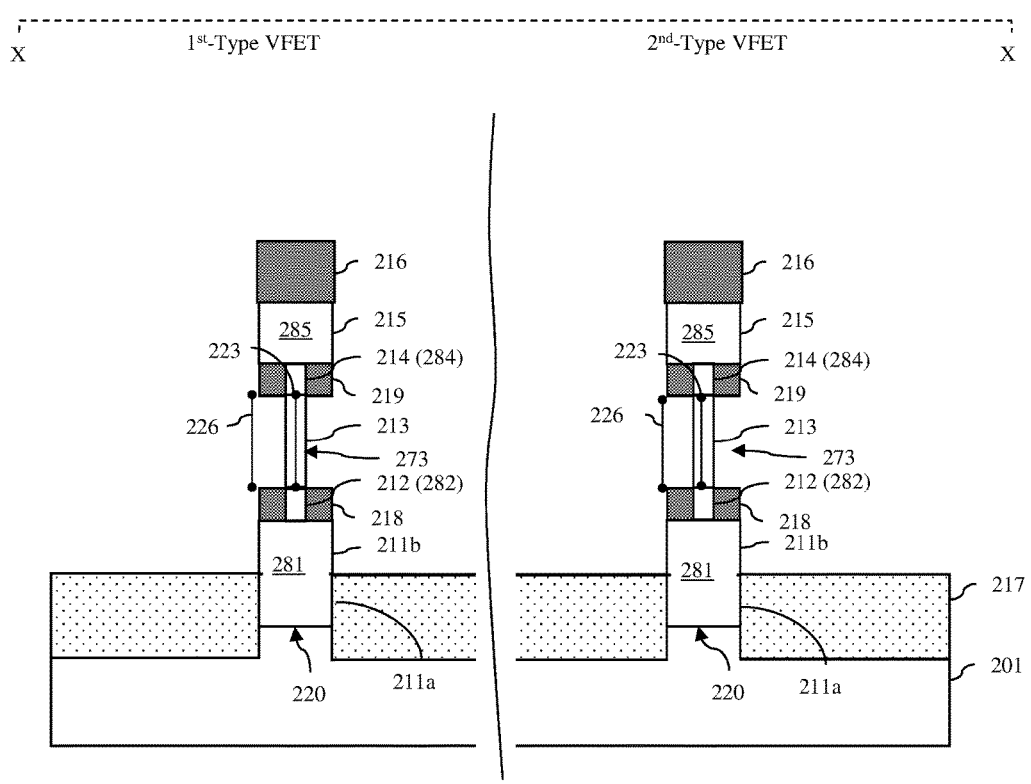
FIG. 7 is a cross-section diagram illustrating a partially completed structure formed according to the flow diagram of FIG. 1.

After the spacers are formed, exposed vertical surfaces of the third semiconductor layer 213 on each multi-layer semiconductor fin 220 can be selectively etched back to form a gate cavity 273 laterally surrounding the third semiconductor layer of the multi-layer semiconductor fin (i.e., between the lower spacer 218 and the upper spacer 219) (see process 114 and FIG. 7). The vertical surfaces of the third semiconductor layer 213 can be etched using, for example, an isotropic etch process that is selective for the first semiconductor material of the third semiconductor material over the second semiconductor material of the first semiconductor layer 211 and the fifth semiconductor layer 215, over the third semiconductor material of the second semiconductor layer 212 and the fourth semiconductor layer 214, and over any adjacent dielectric materials (e.g., of the caps 216 and isolation region 217). For example, if the first semiconductor material of the third semiconductor layer 213 is silicon, the second semiconductor material of the first semiconductor layer 211 and fifth semiconductor layer 215 is silicon germanium with a relatively low germanium percentage (e.g., 25% germanium), and if the third semiconductor material of the second semiconductor layer 212 and the fourth semiconductor layer 214 is silicon germanium with a relatively high germanium percentage (e.g., 50% germanium), a tetrafluoromethane/oxygen/nitrogen ($CF_4/O_2/N_2$) plasma dry etch processor a hydrogen/tetrafluoromethane/Argon ($H_2/CF_4/Ar$) plasma dry etch process could be performed at process 114 to selectively etch back the vertical surfaces of the third semiconductor layer 213. Following process 114, on each multi-layer semiconductor fin 220, the height 226 of the gate cavity 273 will be equal to the third thickness 223 of third semiconductor layer 213.

As a result of the foregoing processes, each of the partially completed VFETs will include a lower source/drain region 281. Each lower source/drain region 281 will have an area of the lower portion 211a of the first semiconductor layer 211 that is defined by the isolation region 217 and also a fin-shaped upper portion 211b of the first semiconductor layer 211 that is within and at the lower end of a multi-layer semiconductor fin 220. This lower source/drain region 281 will be doped with a first-type dopant (e.g., a P-type dopant) so as to have the first-type conductivity (e.g., P-type conductivity) at a relatively high conductivity level. Each of the partially completed VFETs will further have a lower source/drain extension 282 that includes a fin-shaped portion of the second semiconductor layer 212 within the multi-layer semiconductor fin 220 immediately above the lower source/drain region 281. The lower source/drain extension 282 will be laterally surrounded by a lower spacer 218 and will either be undoped or doped with the first-type dopant (e.g., the P-type dopant) so as to have the first-type conductivity (e.g., P-type conductivity) at a lower conductivity level than the lower source/drain region 281. Each of the partially completed VFETs will further have a channel region that includes a fin-shaped portion of the third semiconductor layer 213 within the multi-layer semiconductor fin 220 immediately above the lower source/drain extension 282. The channel region will be undoped. Each of the partially completed VFETs will further have an upper source/drain extension 284 of that includes a fin-shaped portion of the fourth semiconductor layer 214 within the multi-layer semiconductor fin 220 immediately above the channel region. The upper source/drain extension 284 will be laterally surrounded by an upper spacer 219 and will either be undoped or will be doped with the first-type dopant (e.g., the P-type dopant) so as to have the first-type conductivity (e.g., P-type conductivity) at the same level as the lower source/drain extension 282. Each of the partially completed VFETs will further have an upper source/drain region 285 that includes a fin-shaped portion of the fifth semiconductor layer 215 within the multi-layer semiconductor fin 220 immediately above the upper source/drain extension 284. The upper source/drain region 285 will be doped with the first-type dopant (e.g., a P-type dopant) so as to have the first-type conductivity (e.g., P-type conductivity) at the same level as the lower source/drain region 281.

Consequently, at this point in the method, if only first-type VFETs (e.g., P-type VFETs) are to be formed, conventional self-aligned gate processing can be performed in order to complete the first-type VFETs (e.g., the P-type VFETs); however, if any second-type VFETs (e.g., N-type VFETs) are to be formed, additional processing must be performed prior to self-aligned gate processing in order to replace the first-type source/drain regions and extensions with second-type source/drain regions and extensions (e.g., to replace P-type source/drain regions and extensions that are made of silicon germanium, which is optimal for P-type VFET performance, with N-type source/drain regions and extensions that are made of silicon or some other semiconductor material that is optimal for N-type VFET performance) (see process 116).

Figure 8A:
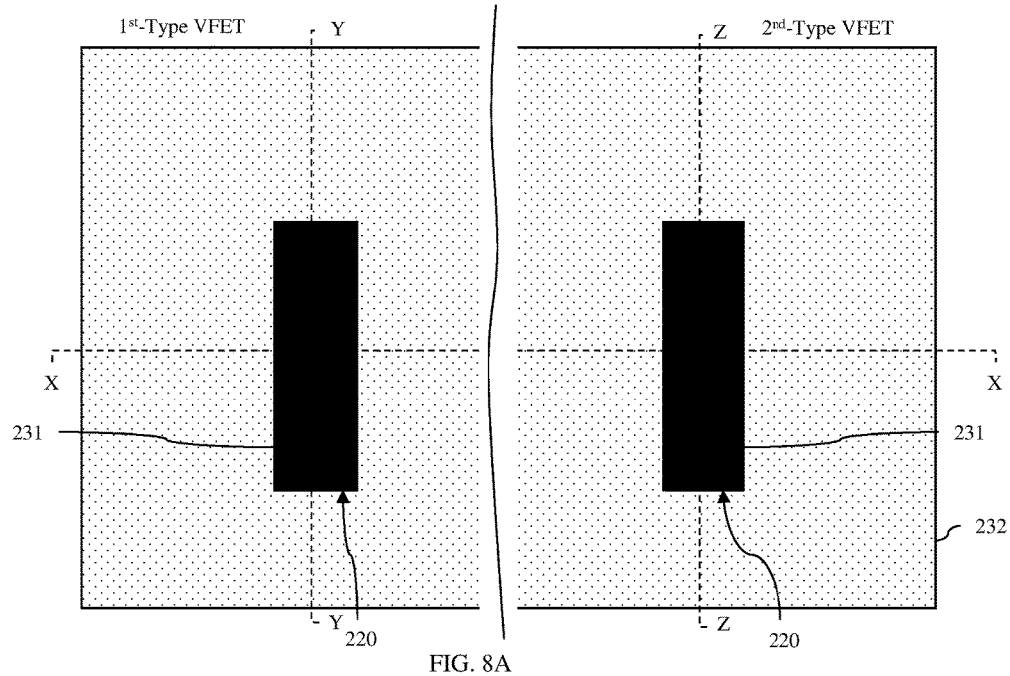
FIG. 8A is a top view diagram and FIGS. 8B-8C are different cross-section diagrams illustrating a partially completed structure formed according to the flow diagram of FIG. 1.
Figure 8B:
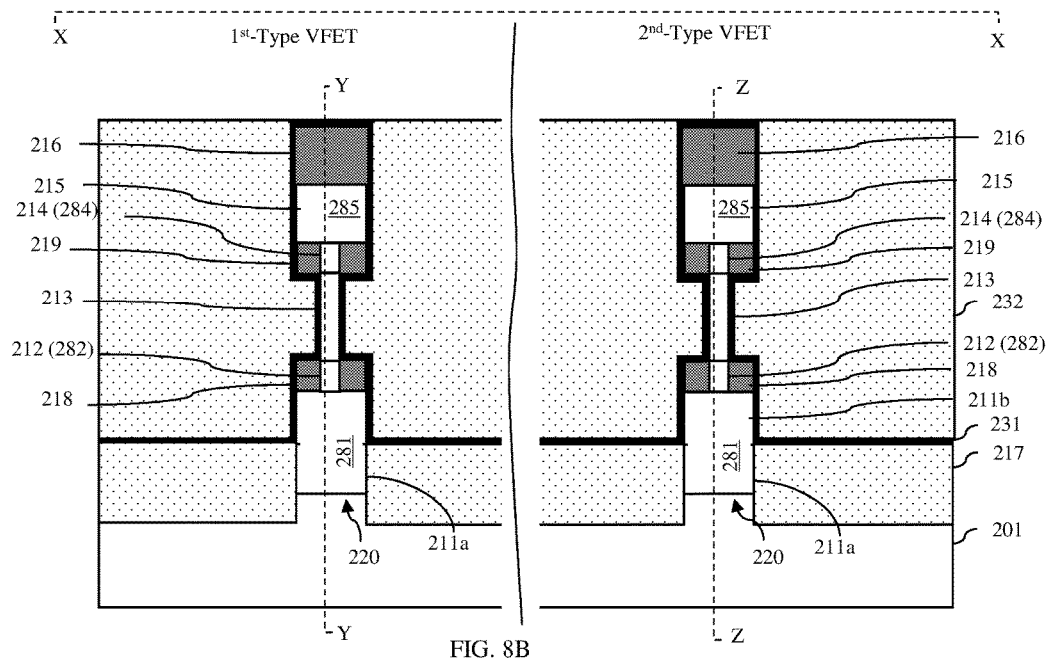
Figure 8C:
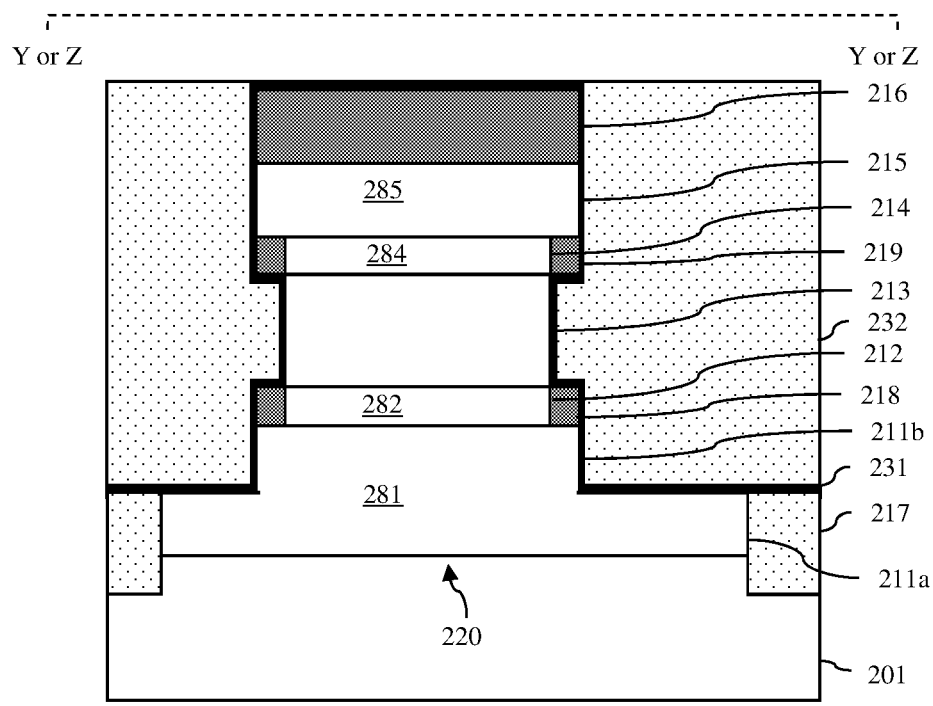
Figure 9A:
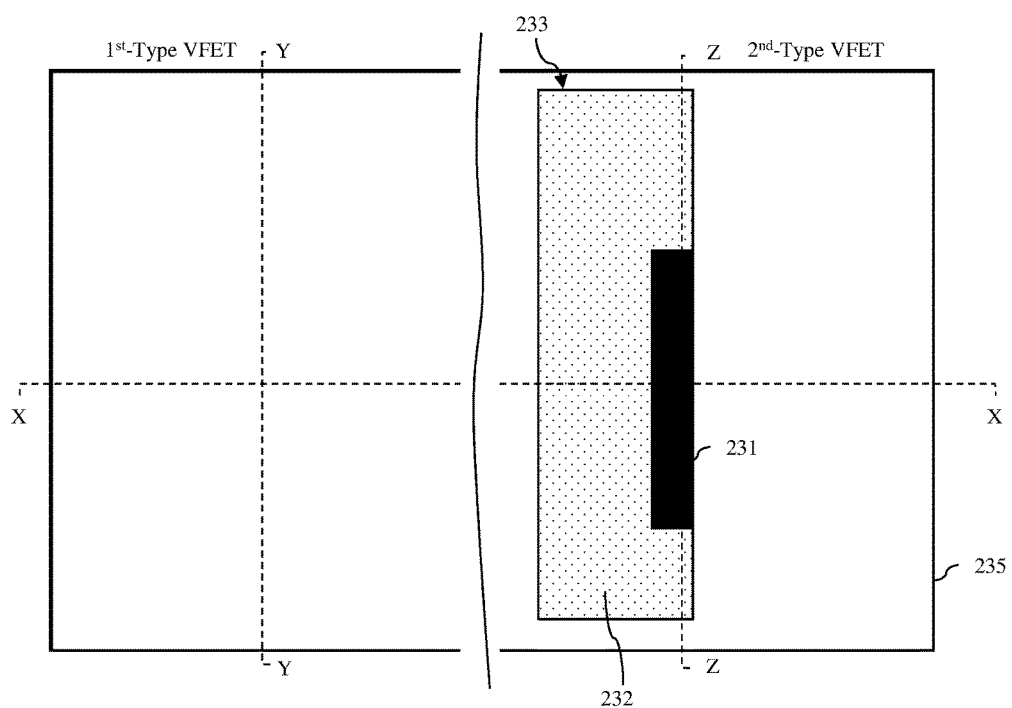
FIG. 9A is a top view diagram and FIGS. 9B-9D are different cross-section diagrams illustrating a partially completed structure formed according to the flow diagram of FIG. 1.
Figure 9B:
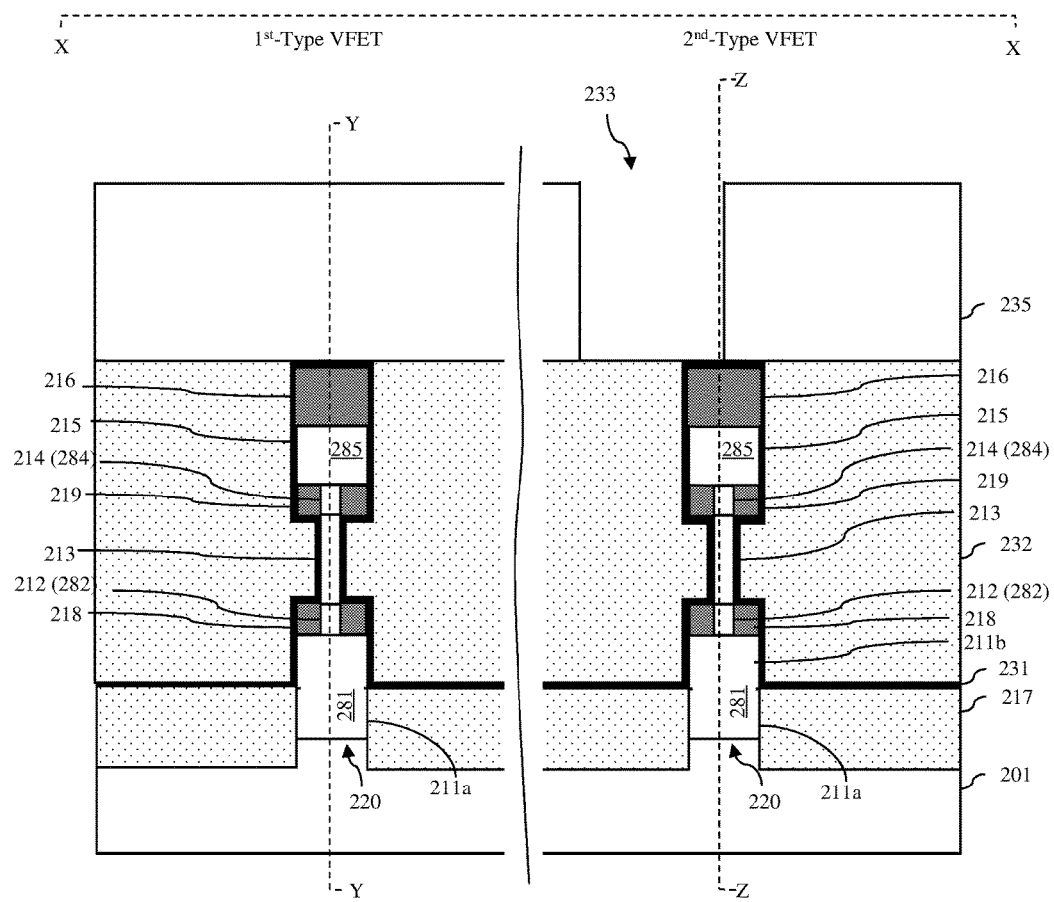
Figure 9C:
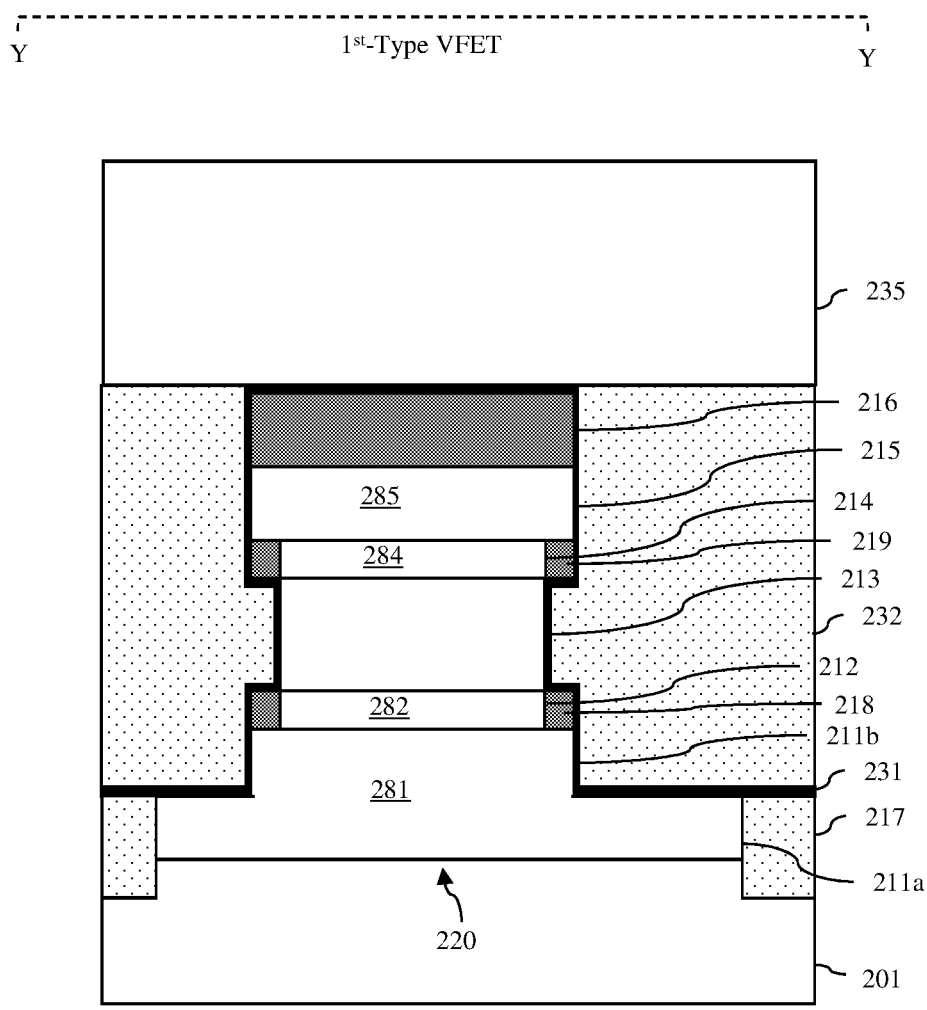
Figure 9D:
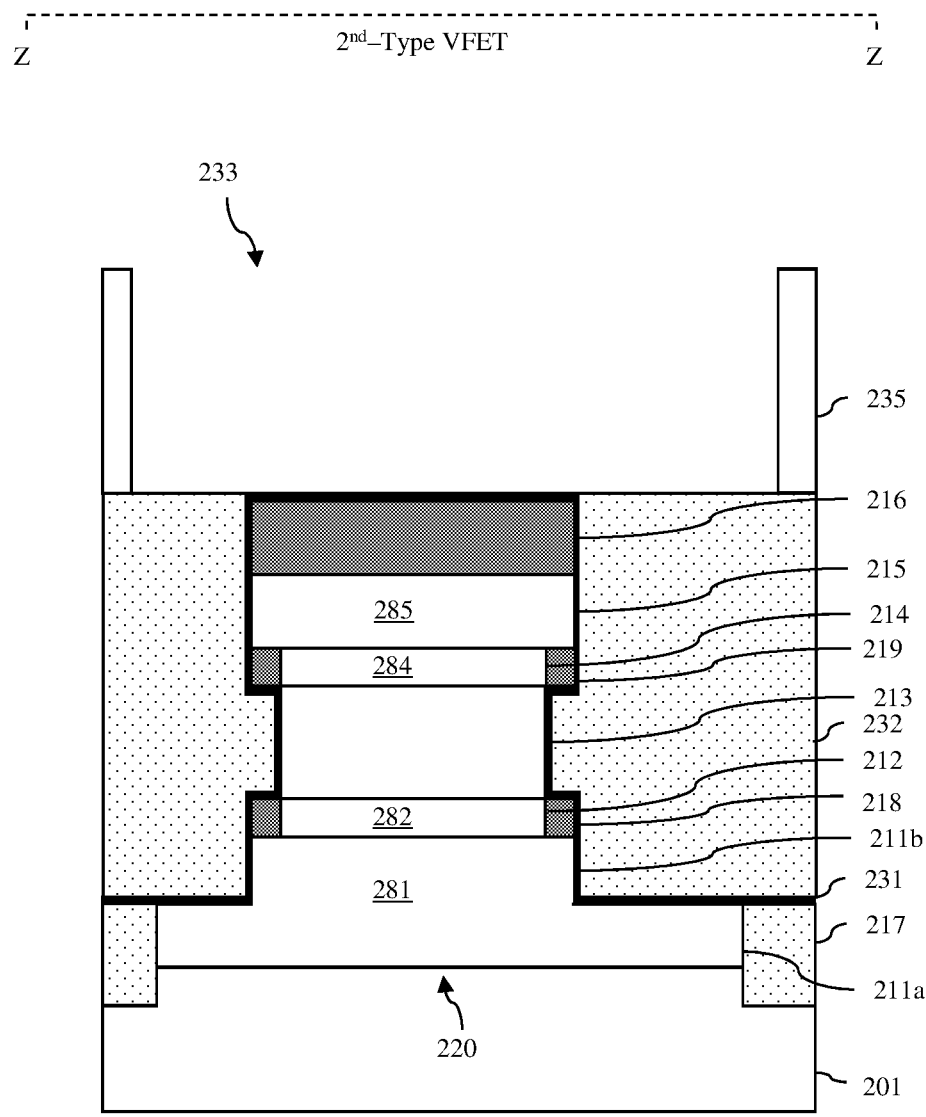

Specifically, when any second-type VFETs (e.g., N-type VFETs) are to be formed, a conformal sacrificial layer 231 can be deposited over the partially completed structure and a blanket sacrificial layer 232 can be deposited onto the conformal sacrificial layer 231 (see process 120 and FIGS. 8A-8C). The conformal sacrificial layer 231 can be, for example, a relatively thin layer of silicon oxycarbide and the blanket sacrificial layer 232 can be, for example, silicon dioxide. Optionally, a polishing process (e.g., a chemical mechanical polishing (CMP) process) can be performed in order to expose horizontal sections of the conformal sacrificial layer 231 on the tops of the capped multi-layer semiconductor fins 220.

Next, an opening 233 can be formed in the sacrificial layers immediately adjacent to any of multi-layer semiconductor fin that will be used to form a second-type VFET (e.g., an N-type VFET). That is, each opening 233 can be formed in the blanket sacrificial layer 232 and conformal sacrificial layer 231 such that it extends vertically to the isolation region 217 and such that it is positioned laterally immediately adjacent to only one of two opposing sides of a selected multi-layer semiconductor fin 220 and, particularly, a multi-layer semiconductor fin designated for second-type VFET formation (e.g., N-type VFET formation) (see process 122 and FIGS. 9A-11B). Specifically, a mask layer 235 (e.g., an optical polymerization layer (OPL)) can be formed so as to cover the top surface of the blanket sacrificial layer 232 and any exposed horizontal sections of the conformal sacrificial layer 231 on the tops of the capped multi-layer semiconductor fins 220. Lithographic patterning and etch processes can then be performed so as to form at least one opening 233 in the mask layer 235. Each opening 233 can be aligned above one side only of at least one selected multi-layer semiconductor fin 220 and, particularly, one side only of a multi-layer semiconductor fin designated for second-type (e.g., N-type) VFET formation (see FIGS. 9A-9D). As illustrated, the opening 233 can expose a portion of the horizontal section of the conformal sacrificial layer above the selected multi-layer semiconductor fin, can expose the interface between a vertical section of the conformal sacrificial layer 231 and the blanket sacrificial layer 232 and can further expose a portion of the adjacent blanket sacrificial layer 232. Optionally, the opening 233 can further be longer than the selected multi-layer semiconductor fin 220 and, thus, can extend beyond the opposing ends of the selected multi-layer semiconductor fin 220. Optionally, a single opening could be formed between and immediately adjacent to two adjacent selected multi-layer semiconductor fins in a row of multi-layer semiconductor fins and these two adjacent selected multi-layer semiconductor fins can be used to form either two adjacent second-type VFETs or a single second-type VFET with multiple channel regions (not illustrated). Optionally, a single relatively long opening could also be formed such that is adjacent to the sides of multiple selected multi-layer semiconductor fins, which are in a column of multi-layer semiconductor fins that are in end to end alignment (not illustrated).

Figure 10A:
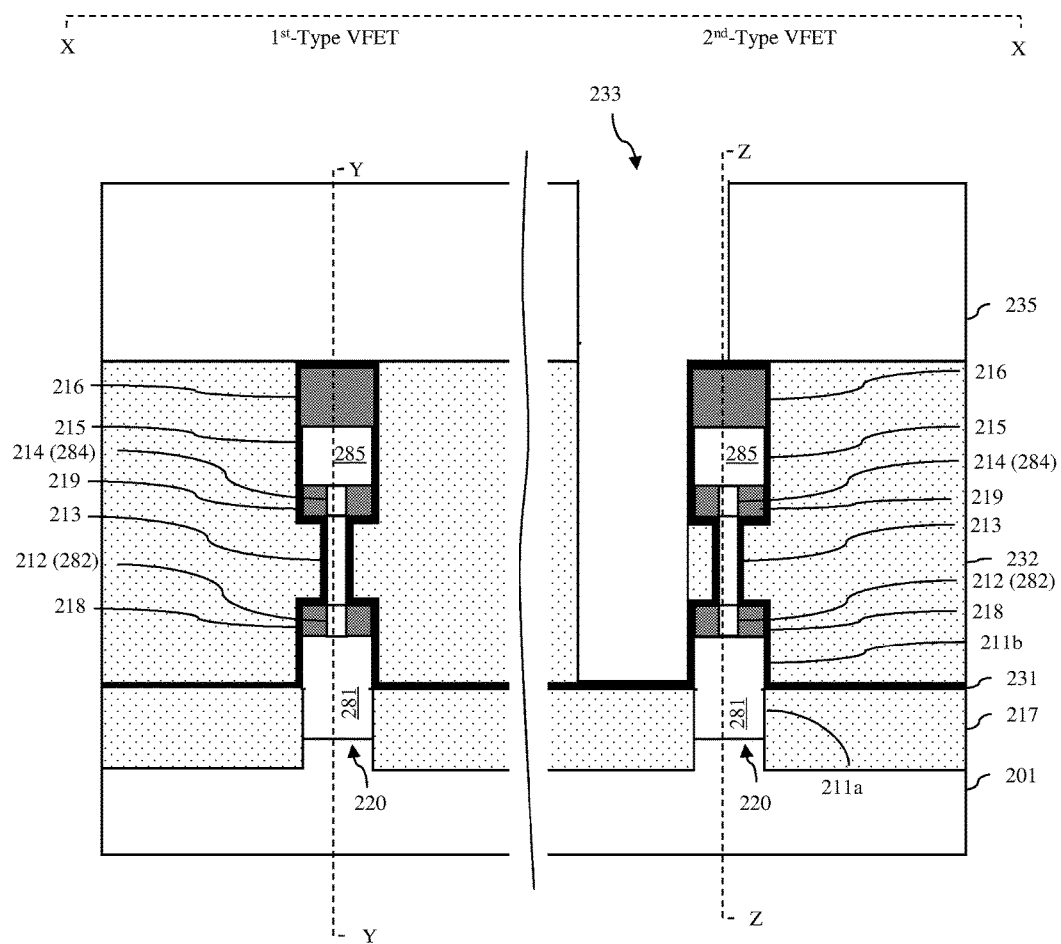
FIGS. 10A-10B are different cross-section diagrams illustrating a partially completed structure formed according to the flow diagram of FIG. 1.
Figure 10B:
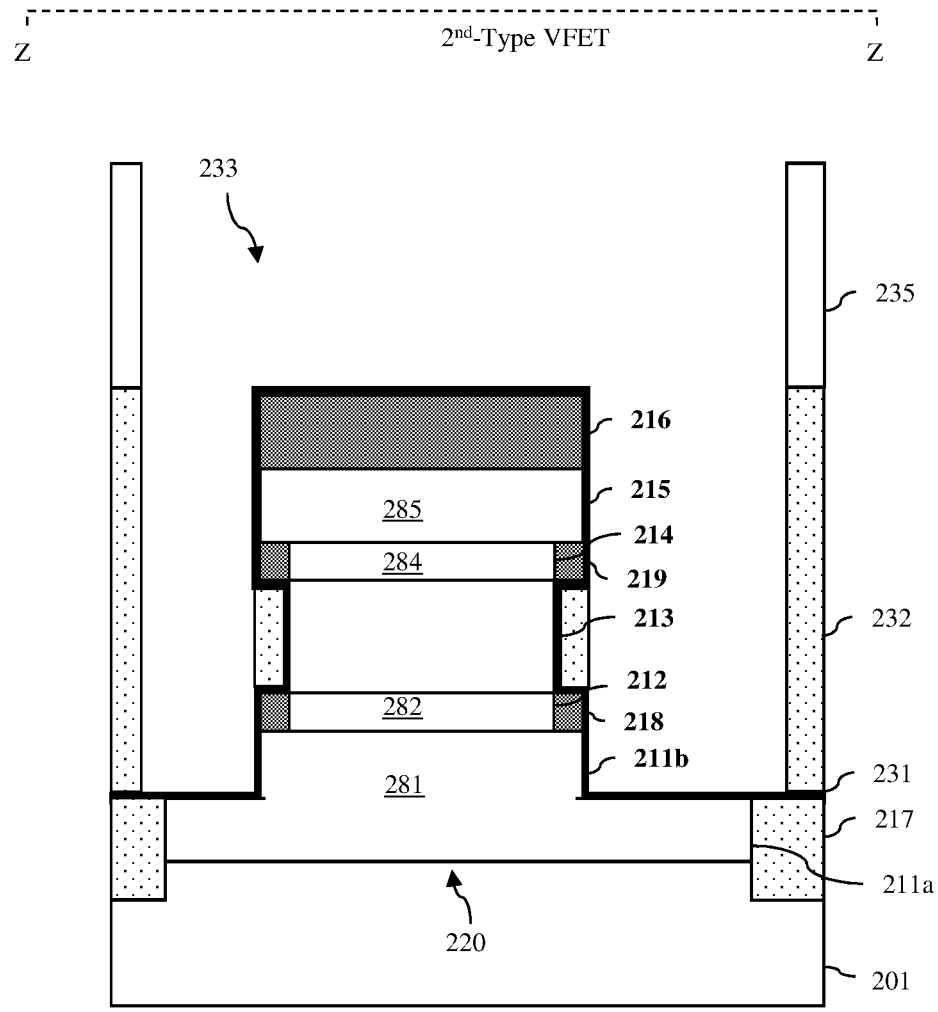
Figure 11A:
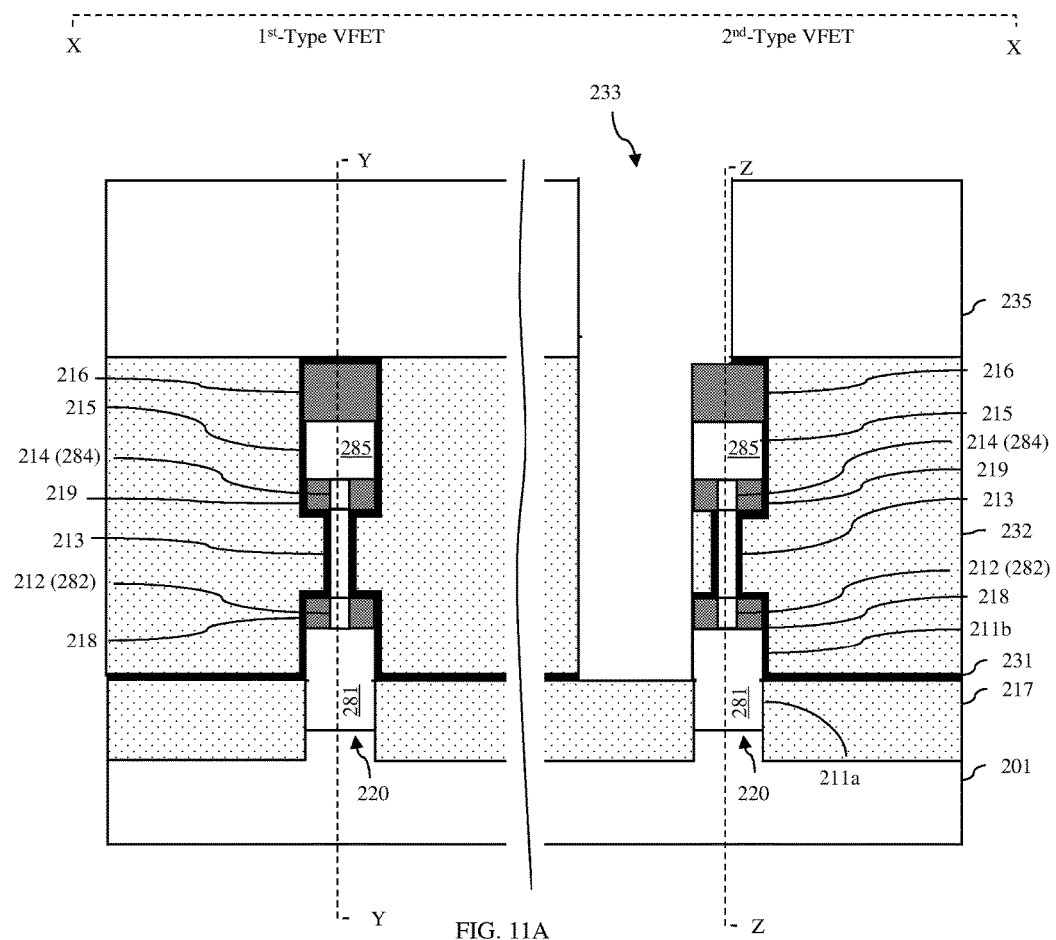
FIGS. 11A-11B are different cross-section diagrams illustrating a partially completed structure formed according to the flow diagram of FIG. 1.
Figure 11B:
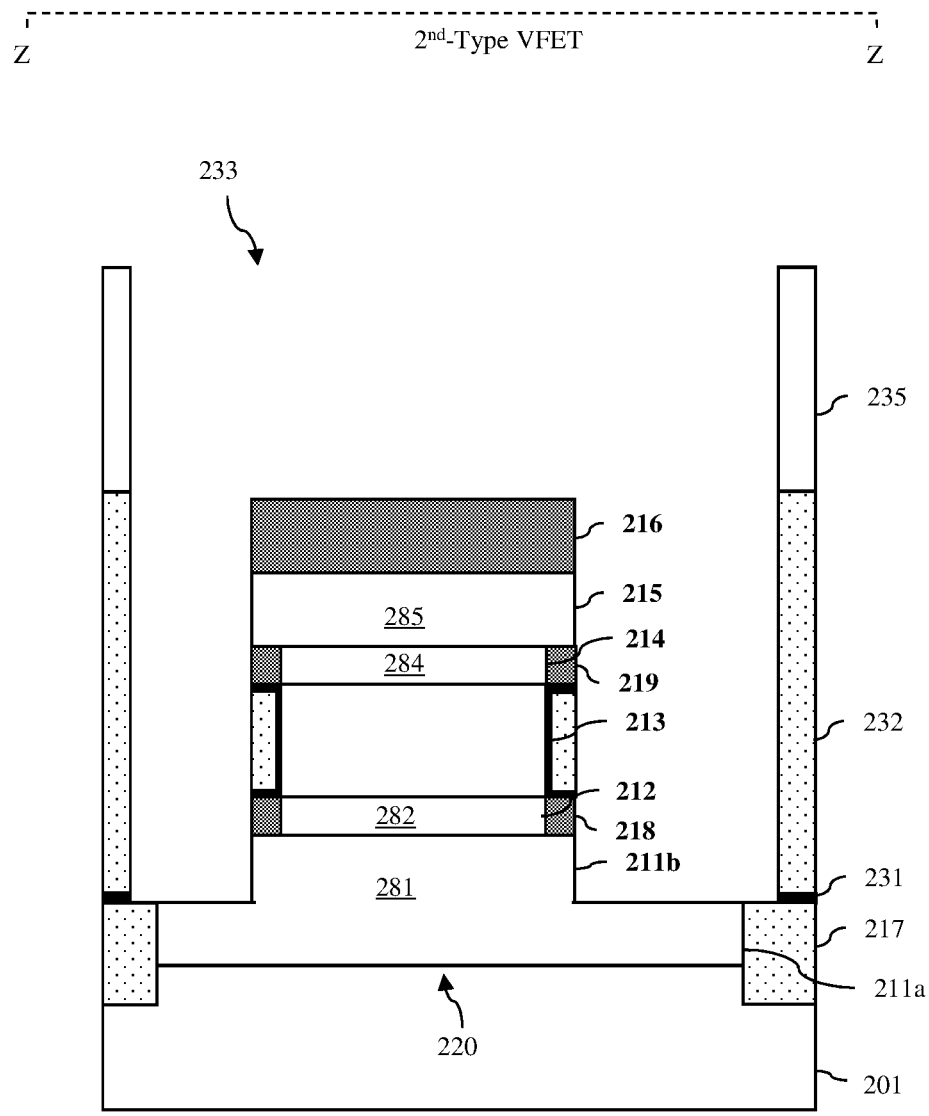

A selective anisotropic etch process (e.g., a reactive ion etch (RIE) process) can then be performed in order to extend this opening 233 completely through the blanket sacrificial layer 232 (FIGS. 10A-10B). Those skilled in the art will recognize that, depending upon the etch specifications used and the degree of etch selectivity to the material of the blanket sacrificial layer, some etching of exposed conformal sacrificial layer material and cap material may occur. Thus, the caps 216 on the fins should be made tall enough to ensure that, during this selective anisotropic etch process, the fifth semiconductor layer 215 at the top of the selected multi-layer semiconductor fin remains protected. Finally, to complete the opening 233, a selective isotropic etch process can be performed so as to remove any of the conformal sacrificial layer 231 remaining within the opening 233 and, thereby expose, within the opening 233, vertical surfaces of the first semiconductor layer 211 and the fifth semiconductor layer 215 on one side and, optionally at the opposing ends of the selected multi-layer semiconductor fin 220 (see FIGS. 11A-11B). It should be noted that, as illustrated in FIG. 11B, if the opening 233 is longer than a selected multi-layer semiconductor fin 220, the top surface of the lower portion 211a of the first semiconductor layer may also be exposed at the opposing ends of the selected multi-layer semiconductor fin 220.

Figure 12A:
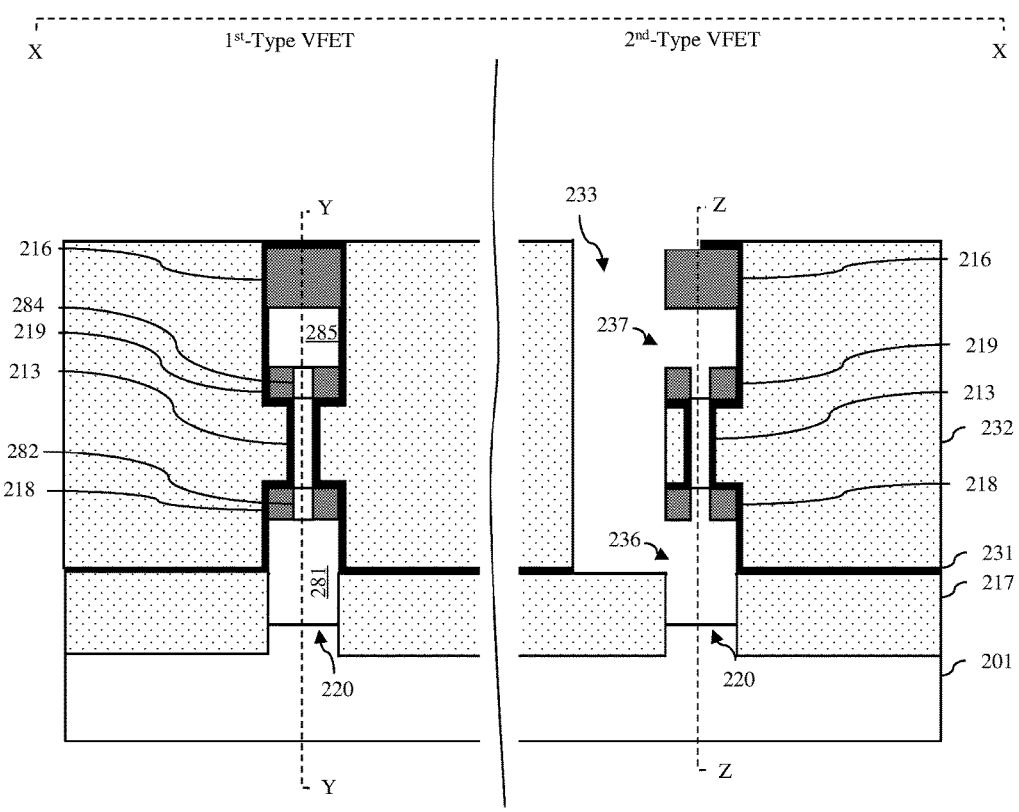
FIGS. 12A-12C are different cross-section diagrams illustrating a partially completed structure formed according to the flow diagram of FIG. 1.
Figure 12B:
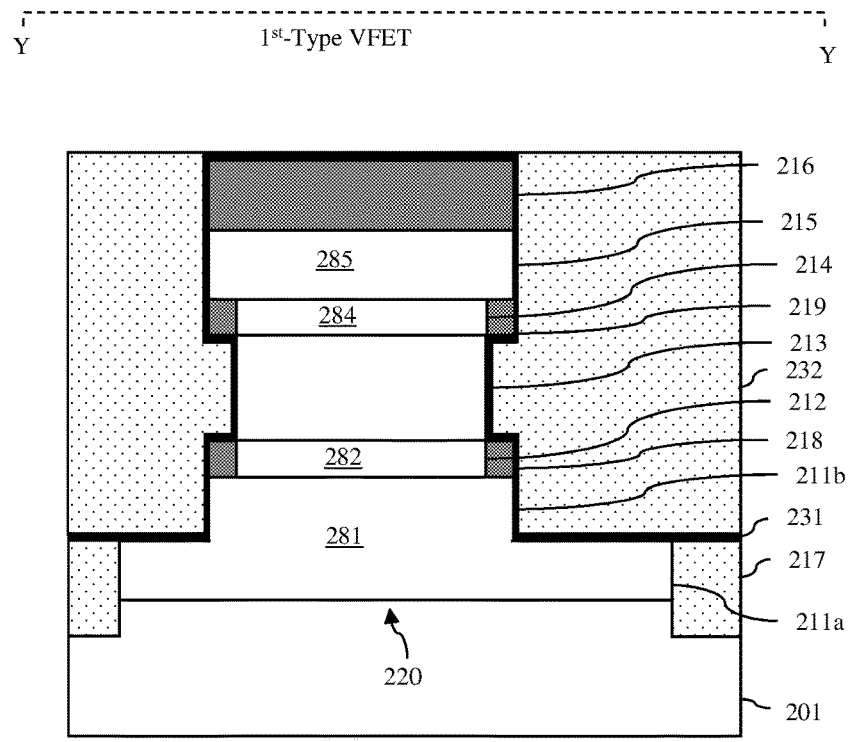
Figure 12C:
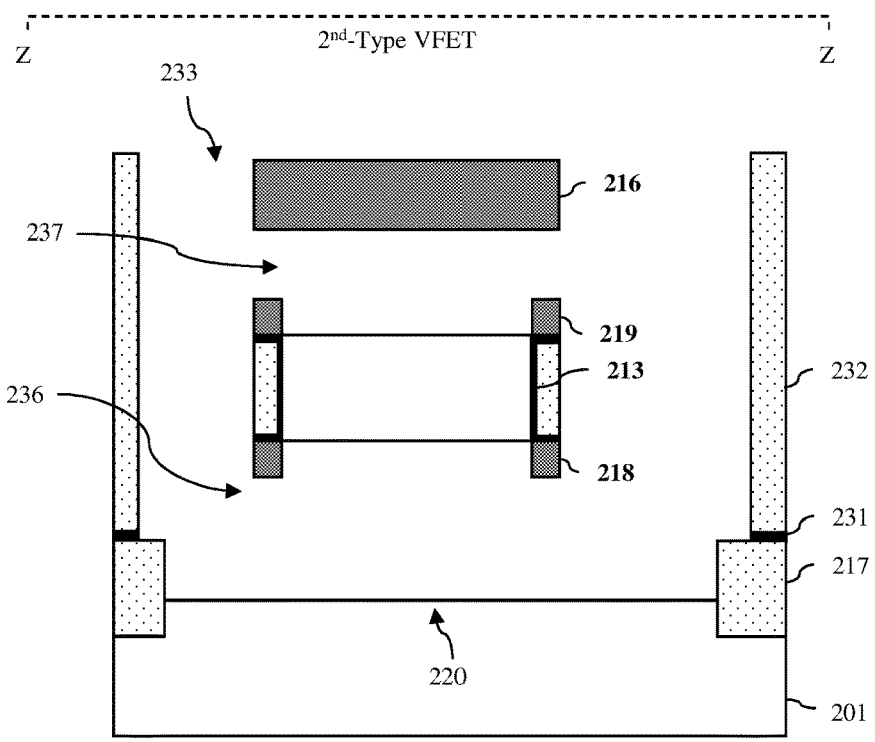

In any case, a selective isotropic etch process can be performed in order to remove exposed material of the first semiconductor layer 211, the second semiconductor layer 212, the fourth semiconductor layer 214 and the fifth semiconductor layer 215 from each opening 233 (see process 124 and FIGS. 12A-12C). The selective isotropic etch process can specifically be performed so as to remove the lower source/drain region and extension 281-282, thereby creating a lower source/drain cavity 236 below the third semiconductor layer 213 of the selected multi-layer semiconductor fin. This selective isotropic etch process can also specifically be performed so as to remove the upper source/drain region and extension 284-285, thereby creating an upper source/drain cavity 237 above the third semiconductor layer 213 of the selected multi-layer semiconductor fin. For example, if the first semiconductor material of the third semiconductor layer 213 is silicon, if the second semiconductor material of the first semiconductor layer 211 and the fifth semiconductor layer 215 is silicon germanium with a relatively low percentage of germanium (e.g., 25% germanium) and if the third semiconductor material of the second semiconductor layer 212 and the fourth semiconductor layer 214 is silicon germanium with a relatively high percentage of germanium (e.g., 50% germanium), a dry hydrochloric acid (HCL) etch process performed can be performed at process 124 to selectively remove exposed material of the first semiconductor layer 211, the second semiconductor layer 212, the fourth semiconductor layer 214 and the fifth semiconductor layer 215. It should be noted that the conditions used during process 124 can be more aggressive than those used during process 110 (e.g., the temperature can be higher, the etch time can be longer, etc.) to ensure that all silicon germanium is removed. It should further be noted that, since the opening 233 only exposes vertical surfaces of the selected multi-layer semiconductor fin 220 on one side and, optionally, at opposing ends, as discussed above at process 122, the blanket sacrificial material 232 on the opposite side will continue to support the remaining fin structure when the cavities 236 and 237 are formed.

Figure 13A:
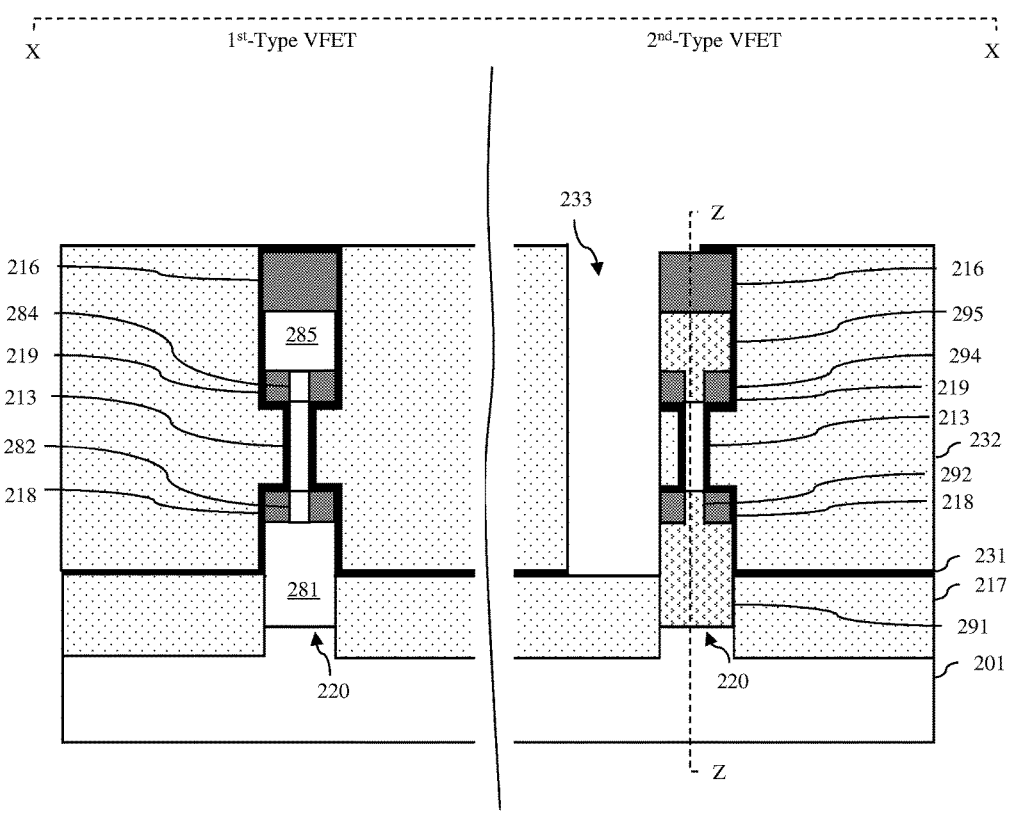
FIGS. 13A-13B are different cross-section diagrams illustrating a partially completed structure formed according to the flow diagram of FIG. 1.
Figure 13B:
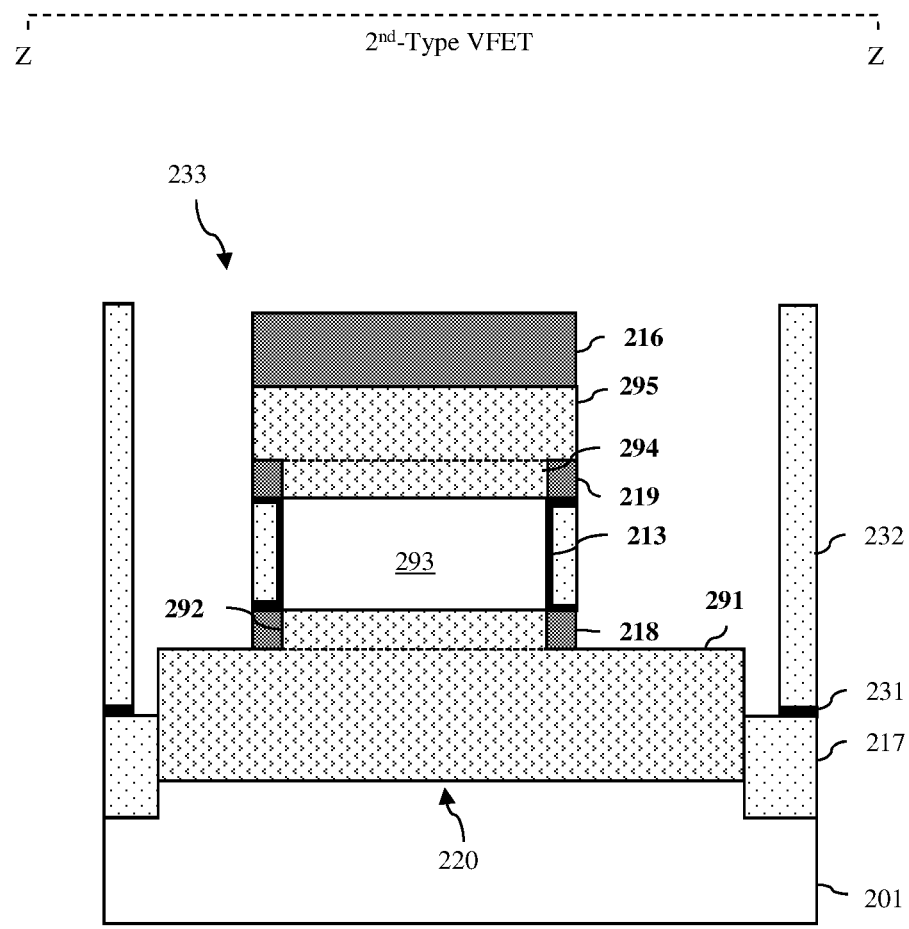

Next, a second-type (e.g., an N-type) lower source/drain region and extension 291-292 can be formed in the lower source/drain cavity 236 and a second-type (e.g., an N-type) upper source/drain region and extension 294-295 can be formed in the upper source/drain cavity 237 (see process 126 and FIGS. 13A-13B). Specifically, a fourth semiconductor material can be epitaxially deposited in the lower source/drain cavity 236 and the upper source/drain cavity 237 and can be in situ-doped so as to have the second-type (e.g., the N-type) conductivity. The fourth semiconductor material can, for example, be the same semiconductor material as the first semiconductor material (e.g., silicon). Alternatively, the fourth semiconductor material can be a different semiconductor material preselected for optimal charge carrier mobility in second-type VFETs. Thus, for example, in the case of an N-type VFET, the fourth semiconductor material could be silicon or silicon carbide. As a result, the second-type (e.g., the N-type) VFET formed using the selected multi-layer semiconductor fin 220 will include a second-type (e.g., N-type) lower source/drain region 291 on the semiconductor substrate 201 and a fin-shaped second-type (e.g., N-type) lower source/drain extension 292, which extends vertically between the second-type lower source/drain region 291 and the third semiconductor layer 213 and which is laterally surrounded by a lower spacer 218. The second-type (e.g., N-type) VFET will also include a fin-shaped second-type (e.g., N-type) upper source/drain region 295 and a fin-shaped second-type (e.g., N-type) upper source/drain extension 294, which extends vertically between the third semiconductor layer 213 and the second-type upper source/drain region 295 and which is laterally surrounding by an upper spacer 219. It should be understood that multiple epitaxial deposition and etch processes can be performed at process 126 in order to ensure the in situ-doped fourth semiconductor material completely fills the lower and upper source/drain cavities 236-237 and does not pinch off in the opening 233 or contain voids.

Figure 14A:
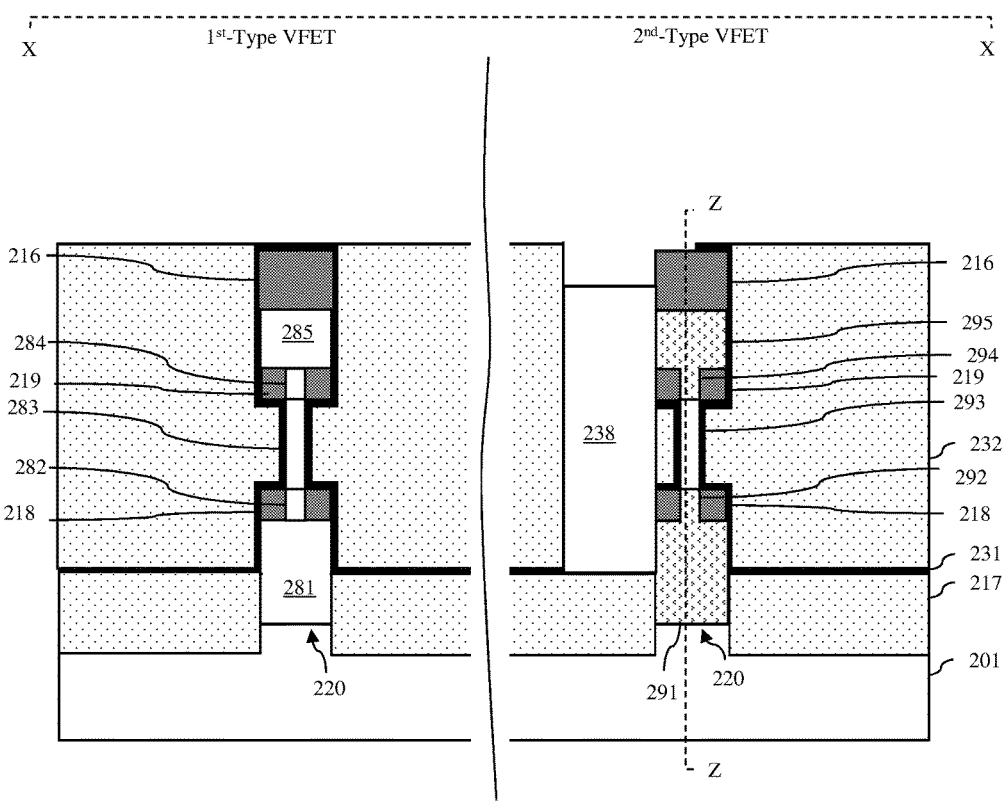
FIGS. 14A-14B are different cross-section diagrams illustrating a partially completed structure formed according to the flow diagram of FIG. 1.
Figure 14B:
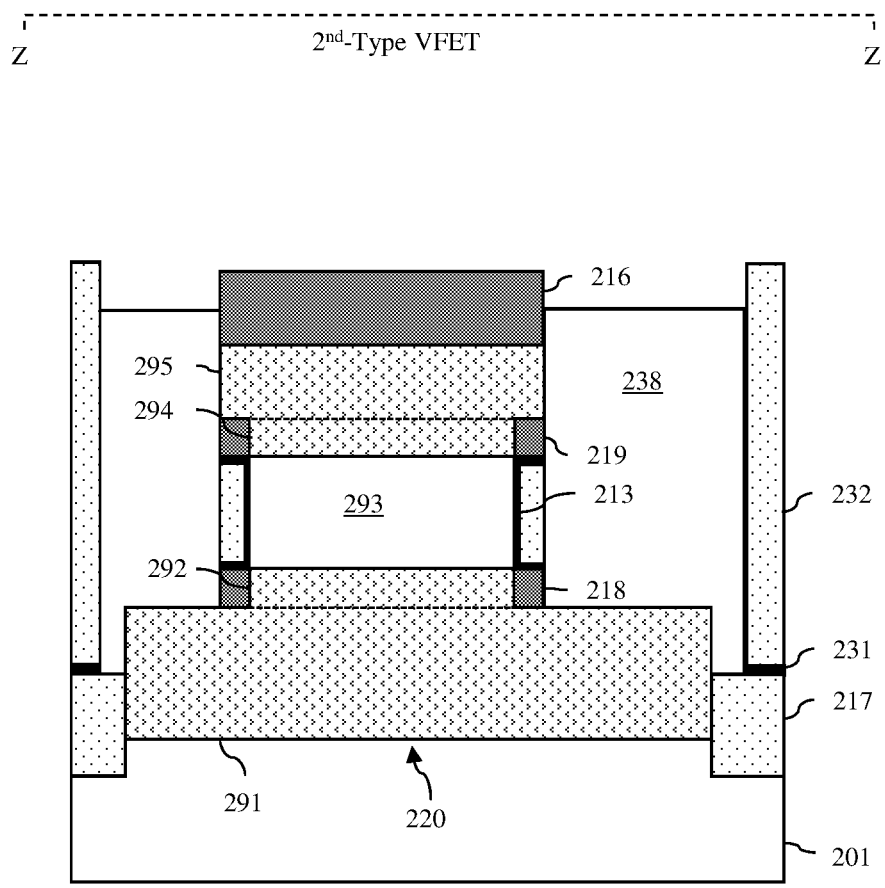
Figure 15A:
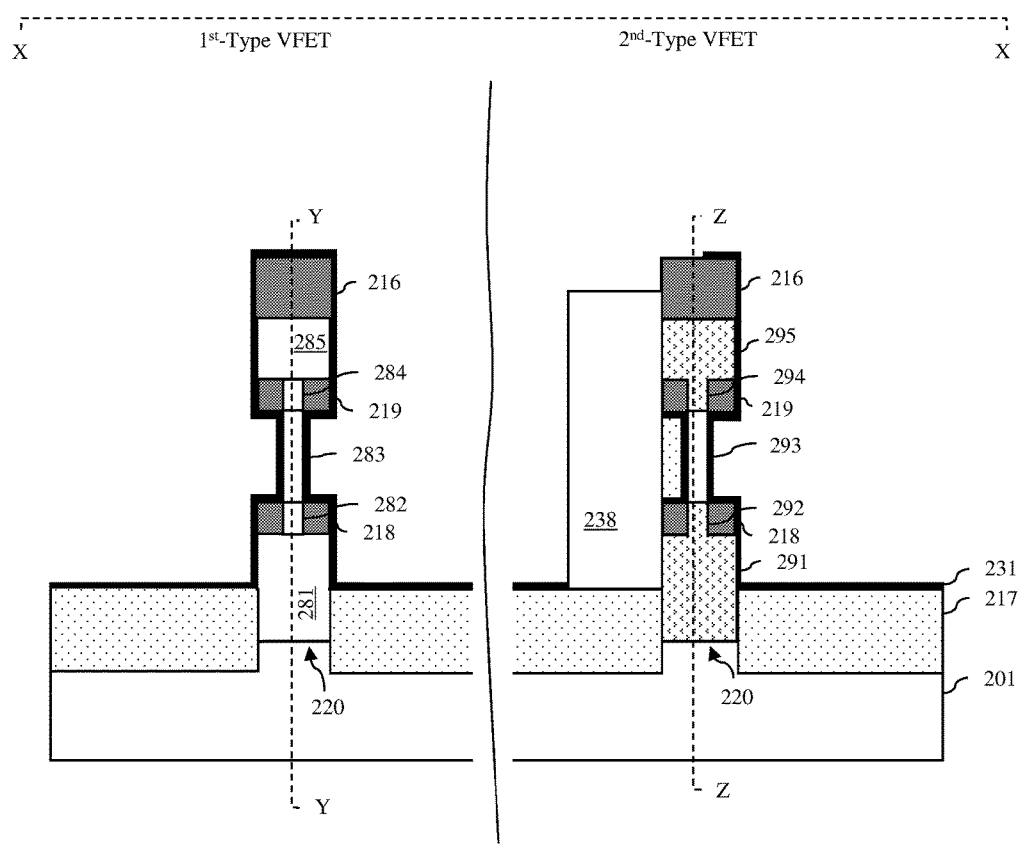
FIGS. 15A-15C are different cross-section diagrams illustrating a partially completed structure formed according to the flow diagram of FIG. 1.
Figure 15B:
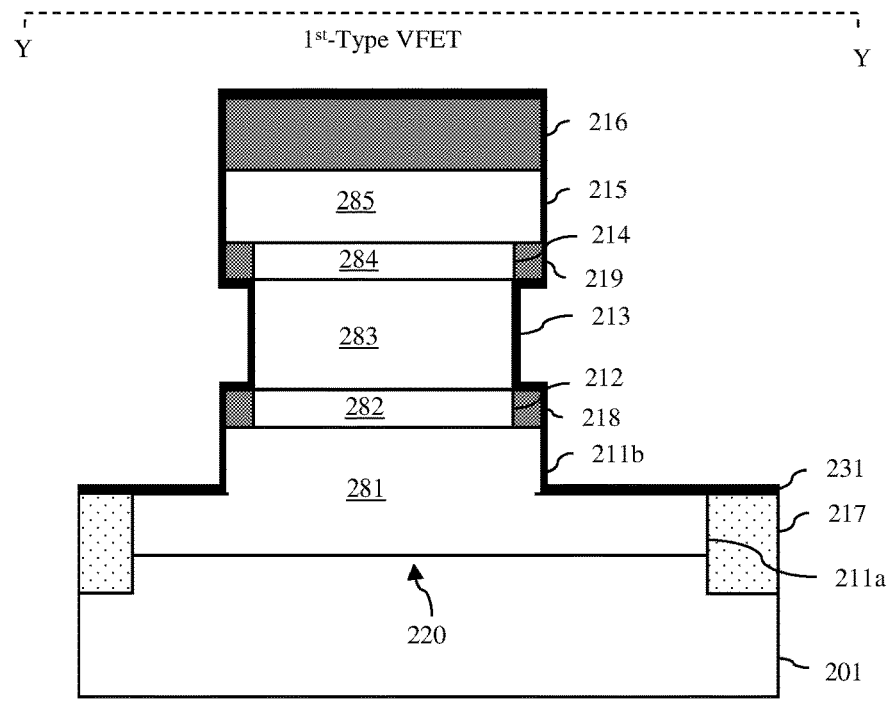
Figure 15C:
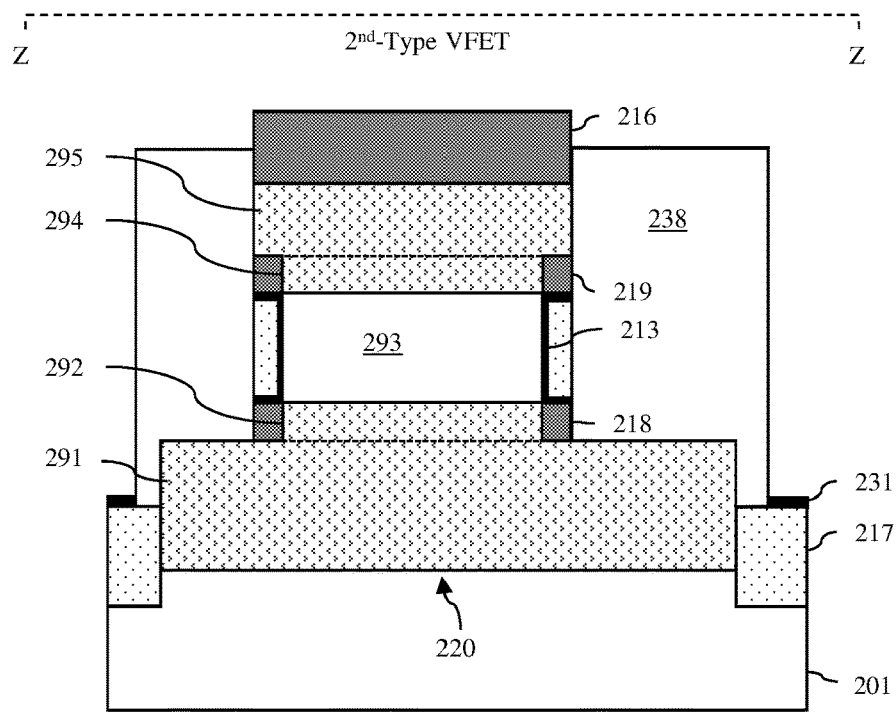
Figure 16A:
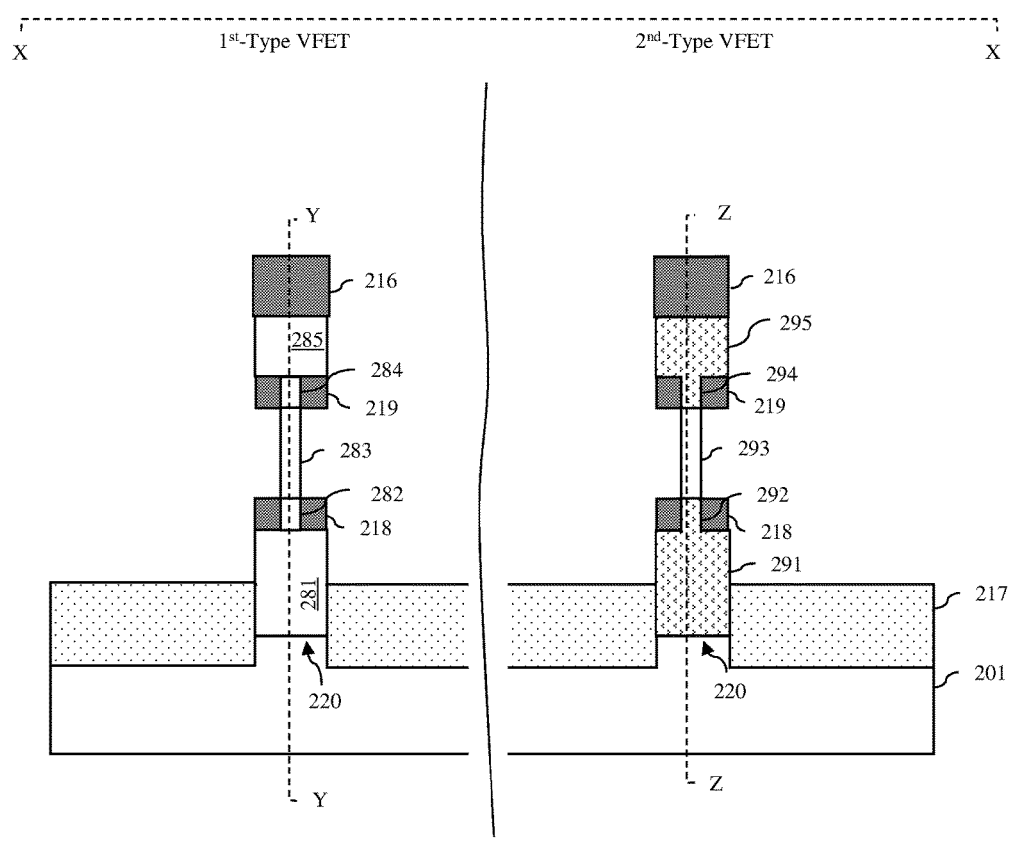
FIGS. 16A-16C are different cross-section diagrams illustrating a partially completed structure formed according to the flow diagram of FIG. 1.
Figure 16B:
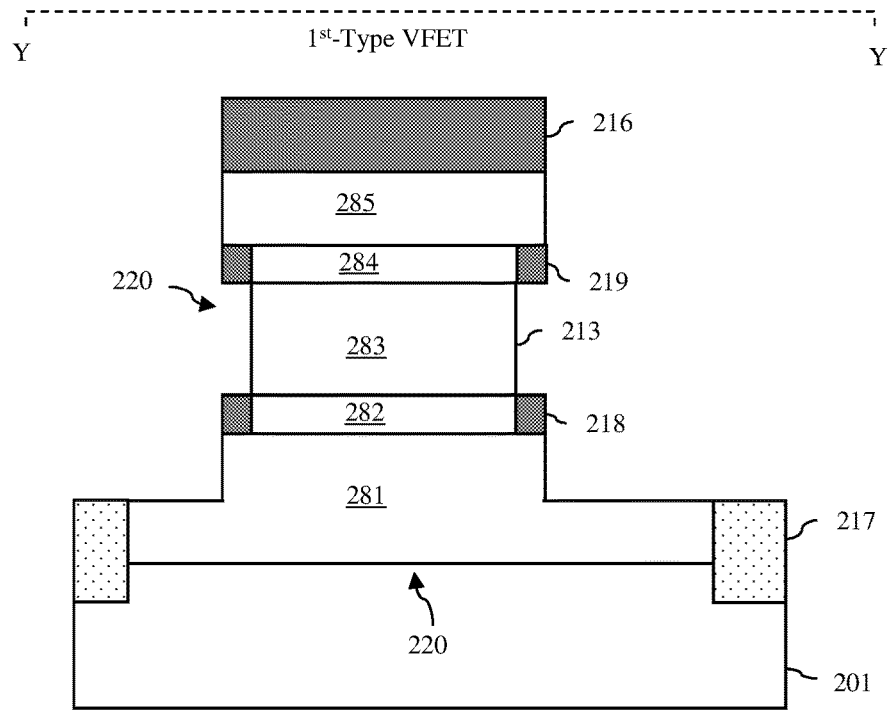
Figure 16C:
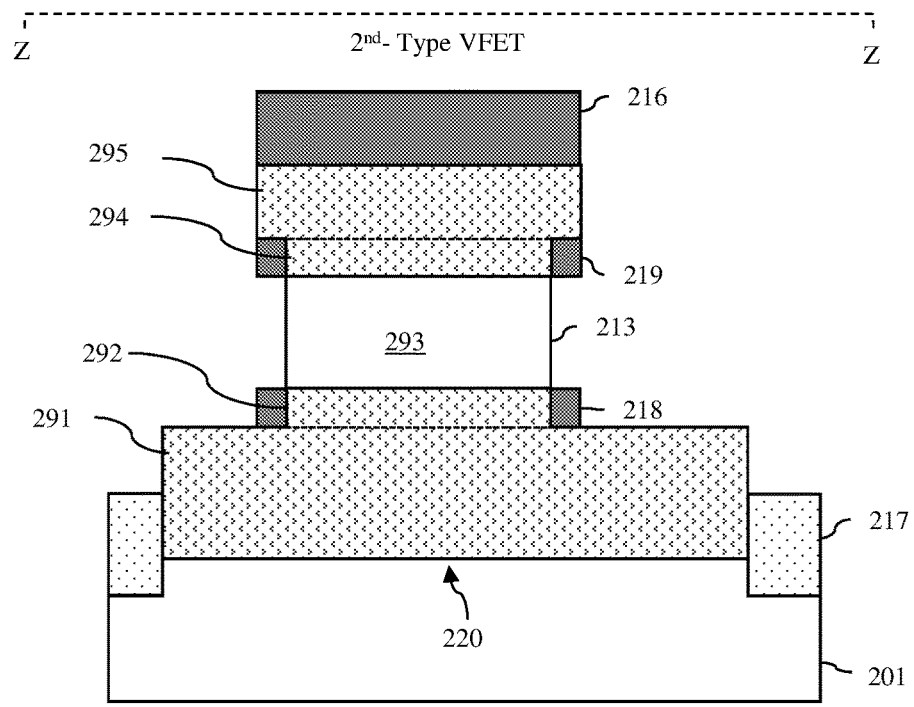

A protective layer 238 (e.g., another OPL) can then be deposited so as to fill the opening(s) 233 and, thereby protect any exposed semiconductor material surfaces during subsequent processing to remove the blanket sacrificial layer 232 (see process 128 and FIGS. 14A-14B). After the protective layer 238 is deposited it can be polished (e.g., using a chemical mechanical polishing (CMP) process) or otherwise etched to expose the top surface of the blanket sacrificial layer 232. Then, exposed portions of the blanket sacrificial layer 232 can be selectively removed (e.g., using a selective isotropic etch process) (see process 130 and FIGS. 15A-15C). The protective layer 238 can then be selectively removed, followed by selective removal of any remaining portions of the blanket sacrificial layer 232 (e.g., from gate cavities previously protected by the protective layer 238) and selective removal of the conformal sacrificial layer 231 (see process 132 and FIGS. 16A-16C). As a result of process 132, vertical surfaces of the third semiconductor layer 213 will be exposed in each gate cavity 273 adjacent to each multi-layer semiconductor fin 220.

Self-aligned gate structures 286 and 296 can then be formed in the gate cavities 273 in order to define the channel region 283 for each first-type VFET 280 (e.g., each P-type VFET) and the channel region 293 for each second-type VFET 290 (e.g., each N-type VFET), respectively (see process 134 and FIG. 17). For example, a conformal gate dielectric layer can be deposited over the partially completed structure. At least one gate conductor layer can be deposited on the conformal gate dielectric layer. For example, a conformal work function metal layer can be deposited and, optionally, a conductive fill material layer can be deposited on the conformal work function metal layer. Next, the gate conductor layer can be polished (e.g., using a conventional CMP process) to expose the tops of the capped multi-layer semiconductor fins 220. Then, using the caps 216 as masks, an anisotropic etch process can be performed in order to pattern the gate conductor and gate dielectric layers (see process 136 and FIGS. 17A-17C). It should be understood that the gate conductor material(s) used for the first-type VFET(s) 280 (e.g., P-type VFET(s)) and the second-type VFET(s) 290 (e.g., N-type VFET(s)) can be the same gate conductor material(s). Alternatively, discrete processes could be used to form self-aligned gate structure(s) 286 for the first-type VFET(s) 280 (e.g., P-type VFET(s)) and to form self-aligned gate structure(s) 296 for second-type VFET(s) 290 (e.g., N-type VFET(s)) so that the gate conductor material(s) of the different type VFETs have different work functions. It should be noted that gate structures for VFETs are well known in the art. Thus, in order to avoid clutter in the drawings and allow the reader to focus on the salient aspects of the disclosed embodiments, only the gate structures 286, 296, as a whole, are identified in the figures and the individual components of these gate structures (e.g., the gate dielectric layer, the work function metal layer, the conductive fill material, etc.) are not specifically identified.

Additionally, gate extensions can be formed to the gate structures 286, 297, respectively, in order to allow the gate structures 286, 297 to be contacted. Specifically, a blanket layer of interlayer dielectric (ILD) material 250 (e.g., silicon dioxide) can be deposited over the partially completed structure. The ILD material 250 can be deposited, for example, using a directional dielectric deposition process such as a gas cluster ion beam (GCIB) deposition process or a high-density plasma (HDP) chemical vapor deposition (CVD) process. Then, a polishing process (e.g., a CMP process) can be performed so as to expose the tops of the caps 216. A mask layer can then be formed on the ILD material 250 and patterned with gate extension openings adjacent to the ends of the VFETs. The gate extension openings can be extended into the ILD material 250 to expose upper vertical surfaces of the gate structures 286 and 296 at the ends of the VFETs. In one embodiment, a conductor can be deposited so as to fill the gate extension openings. The conductor can then be polished (e.g., using a conventional CMP process) and then recessed so that the top surface of the conductor is at or below the level of the interface between the gate structures and the upper spacers, thereby forming the gate extensions 287, 297 (as shown in FIGS. 18A and 18B). The resulting gate extensions 287, 297 are within the gate extension openings above and immediately adjacent to the interlayer dielectric material 250 (and thereby physically separated from the lower source/drain regions). Each gate extension is essentially planar with one end positioned laterally immediately adjacent to a vertical surface of a corresponding gate structure. In another embodiment, a conductor can be conformally deposited into the gate extension openings such that the gate extension openings are lined with the conductor. Next, a protective fill material (e.g., an optical polymerization layer (OPL)) can be deposited on the conductor so as to fill the gate extension openings. The protective fill material can then be recessed so that the top surface of the protective fill material is at or below the level of the interface between the gate structures and the upper spacers. Exposed portions of the conductor can then be selectively etched way. The protective fill material can then be selectively removed. The resulting gate extensions 287', 297' within the gate extension openings each have a horizontal portion that is above and immediately adjacent to the interlayer dielectric material 250 (and thereby physically separated from the lower source/drain regions) and a vertical portion that is positioned laterally immediately adjacent to a vertical surface of a corresponding gate structure (as shown in FIGS. 19A and 19B). In each of the embodiments shown in FIGS. 18A-18B and 19A-19B, the conductor for the gate extensions could be a metal, metal alloy, doped semiconductor material or any other suitable conductor material. Furthermore, it should be understood that, optionally, the gate extensions for different type VFETs could be formed using discrete processes so that the conductor material for the gate extension 287 of the first-type (e.g., P-type) VFET 280 is different from conductor material for the gate extension 297 of the second-type (e.g., N-type) VFET 290. Once the gate extensions are formed, additional ILD material 250' can be deposited and polished so as to fill the gate extension openings.

In any case, using the above-described process steps will result in the lengths (also referred to herein as heights) of the lower and upper spacers 218 and 219 being equal to the heights 228 and 229 of the lower and upper spacer cavities 272 and 274, which, in turn, will be equal to the thicknesses 222 and 224 of the second and fourth semiconductor layers 212 and 214, respectively. Furthermore, using the above-described process steps will also result in the gate length being equal to the height 226 of the gate cavity 273, which, in turn, will be equal to the thickness 223 of the third semiconductor layer 213, respectively. Since epitaxial deposition is used to form the semiconductor layers 211-215, the thicknesses of these layers and thereby the lengths of the lower and upper spacers and the gate structures can be precisely controlled.

Referring to FIG. 17 and to either FIGS. 18A-18B or FIGS. 19A-19B, also disclosed herein are embodiments of an integrated circuit (IC) structure 200 formed according to the above-described method. The IC structure 200 can include a semiconductor substrate 201. The semiconductor substrate 201 can be, for example, a bulk semiconductor substrate made of a first semiconductor material 204. This first semiconductor material 204 can be, for example, monocrystalline silicon. Alternatively, the semiconductor substrate 201 can be the semiconductor layer of a semiconductor-on-insulator structure.

The IC structure 200 can further include one or more vertical field effect transistors (VFETs) on the semiconductor structure. For example, the IC structure 200 can include at least one first-type VFET 280 (e.g., a P-type VFET) and/or at least one second-type VFET 290 (e.g., an N-type VFET) on the semiconductor substrate 201.

The first-type VFET 280 (e.g., a P-type VFET) can include a first lower source/drain region 281 on the semiconductor substrate 201, a first lower source/drain extension 282 on the first lower source/drain region 281, and a first lower spacer 218 on the first lower source/drain region 281 and laterally surrounding the first lower source/drain extension 282. The first-type VFET 280 can further include a first channel region 283 on the first lower source/drain extension 282 and a first gate structure 286 on the first lower spacer 218 and laterally surrounding the first channel region 283. The first-type VFET 280 can further include a first upper source/drain extension 284 on the first channel region 283, a first upper spacer 219 on the first gate structure 286 and laterally surrounding the first upper source/drain extension 284, and a first upper source/drain region 285 on the first upper source/drain extension 284 and extending laterally onto the first upper spacer 219. In this first-type VFET 280, the first channel region 283 can be made of the first semiconductor material (e.g., silicon) and can be undoped. The first lower source/drain region 281 and the first upper source/drain region 285 can be made of a second semiconductor material that is different from the first semiconductor material. For example, the first lower source/drain region 281 and the first upper source/drain region 285 can be made of silicon germanium with a first percentage of germanium (e.g., with 20% germanium, 25% germanium, 30% germanium, or some other relatively low percentage of germanium). The first lower source/drain region 281 and the first upper source/drain region 285 can further be doped with a first-type dopant (e.g., a P-type dopant). The first lower source/drain extension 282 and the first upper source/drain extension 284 can be made of a third semiconductor material that is different from the first and second semiconductor materials. For example, the first lower source/drain extension 282 and the first upper source/drain extension 284 can be made of silicon germanium with a second percentage of germanium that is greater than the first percentage (e.g., with 50% germanium, 55% germanium, 60%, germanium, etc.). The first lower source/drain extension 282 and the first upper source/drain extension 284 can be either undoped or doped with the first-type dopant so as to have a conductivity level that is the same or lower than that of the first lower and upper source/drain regions 281 and 285.

As a result of the process techniques used to form the first-type VFET 280 discussed in detail above, an upper portion of the first lower source/drain region 281, the first lower spacer 218, the first gate structure 286, the first upper spacer 219 and the first upper source/drain region 285 will have essentially vertically aligned sidewalls and the lower portion of the first lower source/drain region 281 will be relatively long so that ends of the lower portion of the first lower source/drain region 281 extend laterally beyond the upper portion of the first lower source/drain region 281, the first lower spacer 218, the first gate structure 286, the first upper spacer 219 and the first upper source/drain region 285. Additionally, the first lower source/drain extension 282 and the first lower spacer 218 of the first-type VFET 280 will have precisely controlled lengths 222 and 228, respectively, that are essentially equal. Additionally, the first upper source/drain extension 284 and the first upper spacer 219 will have precisely controlled lengths 224 and 229, respectively, that are essentially equal. Finally, the first gate structure 286 will have a precisely controlled gate length 226.

The first-type VFET 280 can further have a first gate extension 287, as shown in FIG. 18A, or 287', as shown in FIG. 19A. Specifically, interlayer dielectric (ILD) material 250 (e.g., silicon dioxide) can cover the top surface of the ends of the lower portion of the first lower source/drain region 281 and can laterally surround the other components of the first-type VFET 280 above. A gate extension opening can extend vertically into the ILD material 250 immediately adjacent to one end of the first-type VFET such that a bottom of the gate extension opening is above the level of the top surface of the first lower spacer 218. The first gate extension 287, 287' can be at the bottom of the gate extension opening. For example, in one embodiment, as illustrated in FIG. 18A, the first gate extension 287 can be essentially planar, can be above and immediately adjacent to the ILD material 250 (and thereby physically separated from the first lower source/drain region 281), can have a top surface that is below the level of the first upper spacer 219, and can have one end that is positioned laterally immediately adjacent to a vertical surface of the first gate structure 286. In another embodiment, as illustrated in FIG. 19A, the first gate extension 287' can have a horizontal portion that is above and immediately adjacent to the ILD material 250 (and thereby physically separated from the first lower source/drain region 281) and a vertical portion that extends upward from the horizontal portion, that has a top surface that is below the level of the first upper spacer 219, and that is positioned laterally immediately adjacent to a vertical surface of the first gate structure 286. Additional ILD material 250' can be above the first gate extension 287, 287' and can fill the upper portion of the gate extension opening. A first gate contact (not shown) can extend essentially vertically through the additional ILD material 250' to the first gate extension 287, 287'.

The second-type VFET 290 (e.g., an N-type VFET) can include a second lower source/drain region 291 on the semiconductor substrate 201, a second lower source/drain extension 292 on the second lower source/drain region 291, and a second lower spacer 218 on the second lower source/drain region 291 and laterally surrounding the second lower source/drain extension 292. The second-type VFET 290 can further include a second channel region 293 on the second lower source/drain extension 292 and a second gate structure 296 on the second lower spacer 218 and laterally surrounding the second channel region 293. The second-type VFET 290 can further include a second upper source/drain extension 294 on the second channel region 293, a second upper spacer 219 on the second gate structure 296 and laterally surrounding the second upper source/drain extension 294, and a second upper source/drain region 295 on the second upper source/drain extension 294 and extending laterally onto the second upper spacer 219. In this second-type VFET 290, the second channel region 293 can be the first semiconductor material (e.g., silicon). The second lower source/drain region 291, the second upper source/drain region 295, the second lower source/drain extension 292 and the second upper source/drain extension 294 can all be made of a fourth semiconductor material, which is either the same semiconductor material as the first semiconductor material (e.g., silicon) or a different semiconductor material (e.g., silicon carbide). The second lower source/drain region 291, the second upper source/drain region 295, the second lower source/drain extension 292 and the second upper source/drain extension 294 can all further be doped with a second-type dopant (e.g., an N-type dopant).

As a result of the process techniques used to form the second-type VFET 290 discussed in detail above, the second lower spacer 218, the second gate structure 296, the second upper spacer 219 and the second upper source/drain region 295 will have essentially vertically aligned sidewalls and the second lower source/drain region 291 will be relatively long so that ends of the second lower source/drain region 291 extend laterally beyond the second lower spacer 218, the second gate structure 296, the second upper spacer 219 and the second upper source/drain region 295. Additionally, the second lower source/drain extension 292 and the second lower spacer 218 of the second-type VFET 290 will have precisely controlled lengths 222 and 228, respectively, that are essentially equal. Additionally, the second upper source/drain extension 294 and the second upper spacer 219 will have precisely controlled lengths 224 and 229, respectively, that are essentially equal. Finally, the second gate structure 296 will have a precisely controlled gate length 226.

The second-type VFET 290 can further have a second gate extension 297, as shown in FIG. 18B, or 287', as shown in FIG. 19B. Specifically, interlayer dielectric (ILD) material 250 can cover the top surface of the ends of the second lower source/drain region 291 and can laterally surround the other components of the second-type VFET 290 above. A gate extension opening can extend vertically into the ILD material 250 immediately adjacent to one end of the second-type VFET such that the bottom of the gate extension opening is above the level of the top surface of the second lower spacer 218. The second gate extension 297, 297' can be at the bottom of the gate extension opening. For example, in one embodiment, as illustrated in FIG. 18B, the second gate extension 297 can be essentially planar, can be above and immediately adjacent to the ILD material 250 (and thereby physically separated from the second lower source/drain region 291), can have a top surface that is below the level of the second upper spacer 219, and can have one end positioned laterally immediately adjacent to a vertical surface of the second gate structure 296. In another embodiment, as illustrated in FIG. 19B, the second gate extension 297' can have a horizontal portion that is above and immediately adjacent to the ILD material 250 (and thereby physically separated from the second lower source/drain region 291) and a vertical portion that extends upward from the horizontal portion, that has a top surface that is below the level of the second upper spacer 219, and that is positioned laterally immediately adjacent to a vertical surface of the second gate structure 296. Additional ILD material 250' can be above the second gate extension 297, 297' and can fill the upper portion of the gate extension opening. A second gate contact (not shown) can extend essentially vertically through the additional ILD material 250' to the second gate extension 297, 297'.

It should be noted that, in the case where the IC structure 200 includes both a first-type VFET 280 and a second-type VFET 290, the process techniques used to form the VFETs will results in the lengths of the first lower source/drain extension 282 and the second lower source/drain extension 292 being essentially equal, the lengths of the first upper source/drain extension 284 and the second upper source/drain extension 294 being essentially equal, and the gate lengths of the first gate structure 286 and the second gate structure 296 being essentially equal, as illustrated.

Additionally, it should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

Furthermore, as mentioned above, for both P-type VFETs and N-type VFETs, the gate structures can be made of the same gate conductor material(s). Alternatively, for P-type VFETs, the gate structures can be formed so as to have a first work function, whereas, for N-type VFETs, the gate structures can be formed so as to have a second work function that is different from the first work function. Specifically, the gate structures can have a high-K gate dielectric layer. Those skilled in the art will recognize that a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal gate conductor work function for P-type VFETs can be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function of N-type VFETs can be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The conductive fill material can, for example, be a metal or metal alloy such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming multiple semiconductor layers on a semiconductor substrate, the multiple semiconductor layers comprising a first semiconductor layer, a second semiconductor layer on the first semiconductor layer, a third semiconductor layer on the second semiconductor layer, a fourth semiconductor layer on the third semiconductor layer, and a fifth semiconductor layer on the fourth semiconductor layer;
   patterning the multiple semiconductor layers into a multi-layer semiconductor fin;
   selectively etching exposed vertical surfaces of the second semiconductor layer and the fourth semiconductor layer to form a lower spacer cavity and an upper spacer cavity, respectively;
   forming a lower spacer in the lower spacer cavity and an upper spacer in the upper spacer cavity;
   selectively etching exposed vertical surfaces of the third semiconductor layer to form a gate cavity; and
   forming a gate structure in the gate cavity.

2. The method of claim 1,
   wherein the multiple semiconductor layers are epitaxially deposited such that thicknesses of the multiple semiconductor layers are selectively controlled,
   wherein the lower spacer has a lower spacer length that is essentially equal to a thickness of the second semiconductor layer and the upper spacer has an upper spacer length that is essentially equal to a thickness of the fourth semiconductor layer, and
   wherein the gate structure has a gate length that is essentially equal to a thickness of the third semiconductor layer.

3. The method of claim 1,
   wherein the third semiconductor layer comprises a first semiconductor material,
   wherein the first semiconductor layer and the fifth semiconductor layer comprise a second semiconductor material that is different from the first semiconductor material,
   wherein the second semiconductor layer and the fourth semiconductor layer comprise a third semiconductor material that is different from the first semiconductor material and the second semiconductor material.

4. The method of claim 3,
   wherein the first semiconductor material comprises silicon,
   wherein the second semiconductor material comprises silicon germanium with a first percentage of germanium,
   wherein the third semiconductor material comprises silicon germanium with a second percentage of germanium that is greater than the first percentage.

5. The method of claim 1, wherein the forming of the multiple semiconductor layers comprises epitaxially depositing the multiple semiconductor layers and, during the epitaxially depositing, in situ doping the first semiconductor layer and the fifth semiconductor layer.

6. The method of claim 1, further comprising:
   after the selectively etching of the exposed vertical surfaces of the third semiconductor layer to form the gate cavity and before the forming of the gate structure, performing the following:
   depositing a conformal sacrificial layer;
   depositing a blanket sacrificial layer on the conformal sacrificial layer;
   forming an opening that extends vertically through the blanket sacrificial layer and conformal sacrificial layer, that is positioned laterally immediately adjacent to the multi-layer semiconductor fin and that exposes vertical surfaces of the first semiconductor layer and the fifth semiconductor layer;
   performing an isotropic etch process to selectively remove exposed material of the first semiconductor layer, the second semiconductor layer, the fourth semiconductor layer and the fifth semiconductor layer in the opening in order to create a lower source/drain cavity below the third semiconductor layer and an upper source/drain cavity above the third semiconductor layer;
   forming a lower source/drain region and extension in the lower source/drain cavity and an upper source/drain region and extension in the upper source/drain cavity; and
   removing remaining portions of the blanket sacrificial layer and the conformal sacrificial layer; and
   after the forming of the gate structure, performing the following:
   depositing interlayer dielectric material;
   forming a gate extension opening in the interlayer dielectric material to expose a surface of the gate structure;
   forming a gate extension at a bottom of the gate extension opening such that the gate extension is above and immediately adjacent to the interlayer dielectric material and further such that the gate extension is positioned laterally immediately adjacent to the surface of the gate structure; and
   depositing additional interlayer dielectric material so as to fill the gate extension opening.

7. A method comprising:
   forming multiple semiconductor layers on a semiconductor substrate, the multiple semiconductor layers comprising a first semiconductor layer, a second semiconductor layer on the first semiconductor layer, a third semiconductor layer on the second semiconductor layer, a fourth semiconductor layer on the third semiconductor layer, and a fifth semiconductor layer on the fourth semiconductor layer, wherein the first semiconductor layer and the fifth semiconductor layer are doped with a P-type dopant;
   patterning the multiple semiconductor layers into multi-layer semiconductor fins that extend vertically upward from a lower portion of the first semiconductor layer;
   forming an isolation region in the lower portion of the first semiconductor layer to define shapes of P-type lower source/drain regions;
   on each multi-layer semiconductor fin, selectively etching exposed vertical surfaces of the second semiconductor layer and the fourth semiconductor layer to form a lower spacer cavity and an upper spacer cavity, respectively;
   on each multi-layer semiconductor fin, forming a lower spacer in the lower spacer cavity and an upper spacer in the upper spacer cavity;

on each multi-layer semiconductor fin, selectively etching exposed vertical surfaces of the third semiconductor layer to form a gate cavity;

depositing a conformal sacrificial layer;

depositing a blanket sacrificial layer on the conformal sacrificial layer;

forming an opening that extends vertically through the blanket sacrificial layer and the conformal sacrificial layer to the isolation region, that is positioned laterally immediately adjacent to a side of at least one selected multi-layer semiconductor fin, and that exposes vertical surfaces of the first semiconductor layer and the fifth semiconductor layer on the selected multi-layer semiconductor fin;

performing an isotropic etch process to selectively remove exposed material of the first semiconductor layer, the second semiconductor layer, the fourth semiconductor layer and the fifth semiconductor layer in the opening such that the isotropic etch process creates a lower source/drain cavity below the third semiconductor layer and an upper source/drain cavity above the third semiconductor layer;

forming an N-type lower source/drain region and extension in the lower source/drain cavity and an N-type upper source/drain region and extension in the upper source/drain cavity;

removing remaining portions of the blanket sacrificial layer and the conformal sacrificial layer; and forming a gate structure in each gate cavity, wherein the multiple semiconductor layers are epitaxially deposited such that thicknesses of the multiple semiconductor layers are selectively controlled, wherein, on each multi-layer semiconductor fin, the lower spacer has a lower spacer length that is essentially equal to a thickness of the second semiconductor layer and the upper spacer has an upper spacer length that is essentially equal to a thickness of the fourth semiconductor layer, and wherein, on each multi-layer semiconductor fin, the gate structure has a gate length that is essentially equal to a thickness of the third semiconductor layer.

8. The method of claim 7, wherein the third semiconductor layer comprises a first semiconductor material, wherein the first semiconductor layer and the fifth semiconductor layer comprise a second semiconductor material that is different from the first semiconductor material, wherein the second semiconductor layer and the fourth semiconductor layer comprise a third semiconductor material that is different from the first semiconductor material and the second semiconductor material.

9. The method of claim 8, wherein the N-type lower source/drain region and extension and the N-type upper source/drain region and extension comprise a fourth semiconductor material that is different from at least the second semiconductor material and the third semiconductor material.

10. The method of claim 9, wherein the first semiconductor material comprises silicon, wherein the second semiconductor material comprises silicon germanium with a first percentage of germanium, wherein the third semiconductor material comprises silicon germanium with a second percentage of germanium that is greater than the first percentage, and wherein the fourth semiconductor material comprises any of silicon and silicon carbide.

11. The method of claim 7, further comprising:

after the forming of the gate structure in each gate cavity, depositing interlayer dielectric material;

forming gate extension openings in the interlayer dielectric material such that each gate extension opening exposes a surface of a corresponding gate structure;

forming gate extensions in the gate extension openings such that each gate extension is above and immediately adjacent to the interlayer dielectric material and further such that each gate extension is positioned laterally immediately adjacent to the surface of the corresponding gate structure; and depositing additional interlayer dielectric material so as to fill the gate extension openings.

* * * * *